(12) United States Patent
Kim et al.

(10) Patent No.: US 12,336,401 B2
(45) Date of Patent: Jun. 17, 2025

(54) DISPLAY APPARATUS

(71) Applicant: Samsung Display Co., Ltd., Yongin-si (KR)

(72) Inventors: Sunkwang Kim, Yongin-si (KR); Kangmoon Jo, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/320,012

(22) Filed: May 18, 2023

(65) Prior Publication Data

US 2023/0403898 A1    Dec. 14, 2023

(30) Foreign Application Priority Data

Jun. 9, 2022   (KR) ........................ 10-2022-0070293

(51) Int. Cl.
  *H10K 59/131*   (2023.01)
  *G09G 3/3233*   (2016.01)
  *H10K 59/35*    (2023.01)

(52) U.S. Cl.
  CPC ......... *H10K 59/131* (2023.02); *G09G 3/3233* (2013.01); *G09G 2300/0426* (2013.01); *G09G 2300/0452* (2013.01); *G09G 2300/0819* (2013.01); *G09G 2300/0842* (2013.01); *G09G 2320/0252* (2013.01); *H10K 59/35* (2023.02)

(58) Field of Classification Search
  None
  See application file for complete search history.

(56) References Cited

U.S. PATENT DOCUMENTS

| | | | | |
|---|---|---|---|---|
| 8,520,157 | B2 * | 8/2013 | Ohishi | G09G 3/3648 349/149 |
| 11,296,175 | B2 | 4/2022 | Kim et al. | |
| 2009/0091671 | A1 * | 4/2009 | Tsubata | G02F 1/136286 349/38 |
| 2010/0021829 | A1 | 1/2010 | Kang et al. | |
| 2018/0045866 | A1 * | 2/2018 | Chae | G02F 1/133553 |
| 2018/0124933 | A1 | 5/2018 | Park et al. | |
| 2020/0321292 | A1 | 10/2020 | Park et al. | |
| 2023/0094280 | A1 * | 3/2023 | Lee | G09G 3/3258 345/691 |

FOREIGN PATENT DOCUMENTS

| | | |
|---|---|---|
| KR | 10-2006-0006175 A | 1/2006 |
| KR | 10-2015-0012203 A | 2/2015 |
| KR | 10-2015-0087899 A | 7/2015 |
| KR | 10-2018-0048247 A | 5/2018 |
| KR | 10-2020-0118316 A | 10/2020 |

* cited by examiner

*Primary Examiner* — Matthew Yeung
(74) *Attorney, Agent, or Firm* — Womble Bond Dickinson (US) LLP

(57) ABSTRACT

A display apparatus includes: a substrate having a display area and a peripheral area at a periphery of the display area; a plurality of conductive lines on one side of the peripheral area in a first direction and extending in a second direction crossing the first direction; a first insulating line on the plurality of conductive lines between a first conductive line and a second conductive line, which are adjacent to each other from among the plurality of conductive lines, and extending in the second direction; and a second insulating line on the plurality of conductive lines between a third conductive line and a fourth conductive line, which are adjacent to each other from among the plurality of conductive lines, and extending in the second direction.

15 Claims, 21 Drawing Sheets

DISPLAY APPARATUS

CROSS-REFERENCE TO RELATED APPLICATION

The present application claims priority to and the benefit of Korean Patent Application No. 10-2022-0070293, filed on Jun. 9, 2022, in the Korean Intellectual Property Office, the entire disclosure of which is incorporated herein by reference in its entirety.

BACKGROUND

1. Field

Aspects of one or more embodiments relate to a display apparatus.

2. Description of the Related Art

Display apparatuses visually display data. Display apparatuses may be used as displays for relatively small-sized products such as mobile phones or for relatively large products such as televisions.

Such display apparatuses may each include a substrate including a display area and a non-display area, and in the display area, gate lines and data lines are insulated from each other. A plurality of pixel regions may be defined in the display area, and pixels in each pixel region emit light in response to electrical signals from gate lines and data lines that cross each other to externally display images. In each pixel region, a thin-film transistor and a pixel electrode electrically connected thereto are arranged, and an opposite electrode is commonly included in the pixel regions. In the non-display area, various lines configured to transmit electrical signals to the pixels in the display area, a gate driver, pads, to which a data driver and a controller may be connected, and the like may be arranged.

Recently, display apparatuses have been used in various fields. Also, as the thickness and weight of display apparatuses have been reduced, the range of use of display apparatuses has widened. Recently, as the use of display apparatuses has diversified, various designs have been made to improve the quality of display apparatuses.

The above information disclosed in this Background section is only for enhancement of understanding of the background and therefore the information discussed in this Background section does not necessarily constitute prior art.

SUMMARY

Aspects of one or more embodiments include a display apparatus in which a deviation in the signal delay of signals applied to a display area may be relatively reduced, and horizontal irregularity resulting from the signal delay deviation may be prevented or reduced.

Technical characteristics of embodiments according to the present disclosure are not limited to those mentioned above, and other technical goals not mentioned may be clearly understood by one of ordinary skill in the art from the descriptions below.

Additional aspects will be set forth in part in the description which follows and, in part, will be apparent from the description, or may be learned by practice of the presented embodiments of the disclosure.

According to one or more embodiments, a display apparatus includes a substrate on which are defined a display area and a peripheral area on a periphery of the display area, conductive lines arranged on one side of the peripheral area in a first direction and extending in a second direction crossing the first direction, a first insulating line arranged on the conductive lines, arranged between a first conductive line and a second conductive line, which are adjacent to each other from among the conductive lines, and extending in the second direction, and a second insulating line arranged on the conductive lines, arranged between a third conductive line and a fourth conductive line, which are adjacent to each other from among the conductive lines, and extending in the second direction.

According to some embodiments, the first conductive line, the second conductive line, the third conductive line, and the fourth conductive line may be sequentially arranged in the first direction, and the display apparatus may further include at least one third insulating line arranged on the plurality of conductive lines, arranged between conductive lines located between the second conductive line and the third conductive line from among the plurality of conductive lines, and extending in the second direction.

According to some embodiments, a length of the at least one third insulating line in the second direction may be less than each of a length of the first insulating line in the second direction and a length of the second insulating line in the second direction.

According to some embodiments, a width of the at least one third insulating line in the first direction may be greater than or substantially the same as each of a width of the first insulating line in the first direction and a width of the second insulating line in the first direction.

According to some embodiments, first edges on both sides of the first insulating line extending in the second direction may be arranged between a first center line of the first conductive line and a second center line of the second conductive line that are in the second direction, and second edges on both sides of the second insulating line extending in the second direction may be arranged between a third center line of the third conductive line and a fourth center line of the fourth conductive line that are in the second direction.

According to some embodiments, the display apparatus may further include an insulating pattern arranged to overlap at least a portion of the second conductive line and the third conductive line on the plurality of conductive lines and connecting the first insulating line to the second insulating line.

According to some embodiments, the insulating pattern may be provided in plurality, and the plurality of insulating patterns may be arranged apart from each other in the second direction.

According to some embodiments, each of the plurality of conductive lines may include a plurality of lower conductive lines arranged apart from each other in the second direction, and an upper conductive line extending in the second direction and overlapping the plurality of lower conductive lines, and the number of the plurality of lower conductive lines of each of the plurality of conductive lines arranged between insulating patterns that are adjacent to each other in the second direction from among the plurality of insulating patterns, may be k. (where, k is a natural number.)

According to some embodiments, each of the plurality of conductive lines may include a plurality of lower conductive lines arranged apart from each other in the second direction and an upper conductive line extending in the second direction and overlapping the plurality of lower conductive lines, and the plurality of lower conductive lines of each of the plurality of conductive lines and the plurality of insulating patterns may be alternately arranged in the second direction.

According to some embodiments, the first insulating line and the second insulating line may each be provided in plurality, the plurality of first insulating lines may be arranged apart from each other in the second direction, the plurality of second insulating lines may be arranged apart from each other in the second direction, the plurality of first insulating lines and the plurality of second insulating lines may be alternately arranged in the second direction, and the insulating pattern may include a plurality of first insulating patterns, which connect respective first ends of the plurality of first insulating lines to respective second ends of the plurality of second insulating lines, and a plurality of second insulating patterns, which connect respective third ends of the plurality of first insulating lines to respective fourth ends of the plurality of second insulating lines, wherein the third ends face the first ends and the fourth ends face the second ends.

According to some embodiments, the plurality of first insulating patterns and the plurality of second insulating patterns may be alternately arranged in the second direction.

According to some embodiments, the display apparatus may further include a transistor arranged in the display area and including a semiconductor layer and a gate electrode on the semiconductor layer, a buffer layer between the substrate and the semiconductor layer, and an interlayer insulating layer arranged on the gate electrode, wherein each of the plurality of conductive lines may include a lower conductive line arranged between the substrate and the buffer layer, and an upper conductive line overlapping the lower conductive line on the interlayer insulating layer and electrically connected to the lower conductive line.

According to some embodiments, the display apparatus may further include a plurality of pixels arranged in the display area, wherein each of the plurality of pixels may include a light-emitting diode including an anode and a cathode, a driving transistor configured to control a size of a driving current flowing to the light-emitting diode, a scan transistor configured to transmit a data voltage to a gate of the driving transistor in response to a scan signal, and a sensing transistor configured to transmit a sensing voltage or an initialization voltage to the anode of the light-emitting diode in response to sensing signal, wherein the scan signals may be respectively output according to scan clock signals transmitted through some of the plurality of conductive lines, and the sensing signals may be respectively output according to sensing clock signals transmitted through others of the plurality of conductive lines.

According to some embodiments, the some of the plurality of conductive lines may include the first conductive line and the second conductive line, and the others of the plurality of conductive lines may include the third conductive line and the fourth conductive line.

According to some embodiments, the display apparatus may further include a first light-emitting diode, a second light-emitting diode, and a third light-emitting diode which are arranged in the display area and include a first color emission layer, a second-color quantum dot layer and a third-color quantum dot layer respectively arranged on the second light-emitting diode and the third light-emitting diode, a penetration layer arranged on the first light-emitting diode, and a first-color color filter layer, a second-color color filter layer, and a third-color color filter layer respectively arranged on the penetration layer, the second-color quantum dot layer, and the third-color quantum dot layer.

According to some embodiments, a display apparatus includes a substrate on which are defined a display area and a peripheral area on a periphery of the display area, a plurality of conductive lines arranged on one side of the peripheral area in a first direction and extending in a second direction crossing the first direction, and a plurality of insulating patterns arranged on the plurality of conductive lines in the second direction and having lengthwise directions in the first direction, wherein the plurality of insulating patterns at least partially overlap some of the plurality of conductive lines on a plane.

According to some embodiments, each of the some of the plurality of conductive lines may include a plurality of lower conductive lines arranged apart from each other in the second direction and an upper conductive line extending in the second direction and overlapping the plurality of lower conductive lines, and the number of the plurality of lower conductive lines of each of the some of the plurality of conductive lines arranged between insulating patterns that are adjacent to each other in the second direction from among the plurality of insulating patterns, may be k. (where, k is a natural number.)

According to some embodiments, each of the some of the plurality of conductive lines may include a plurality of lower conductive lines arranged apart from each other in the second direction and an upper conductive line extending in the second direction and overlapping the plurality of lower conductive lines, and the plurality of lower conductive lines of each of the some of the plurality of conductive lines and the plurality of insulating patterns may be alternately arranged in the second direction.

According to some embodiments, the display apparatus may further include a plurality of pixels arranged in the display area, wherein each of the plurality of pixels includes: a light-emitting diode including an anode and a cathode, a driving transistor configured to control a size of a driving current flowing to the light-emitting diode, a scan transistor configured to transmit a data voltage to a gate of the driving transistor in response to a scan signal, and a sensing transistor configured to transmit a sensing voltage or an initialization voltage to the anode of the light-emitting diode in response to a sensing signal, wherein the scan signals and the sensing signals are respectively output in response to scan clock signals and sensing clock signals transmitted through the plurality of conductive lines.

According to some embodiments, the display apparatus may further include a first light-emitting diode, a second light-emitting diode, and a third light-emitting diode which are arranged in the display area and include a first color emission layer, a second-color quantum dot layer and a third-color quantum dot layer respectively arranged on the second light-emitting diode and the third light-emitting diode, a penetration layer arranged on the first light-emitting diode, and a first-color color filter layer, a second-color color filter layer, and a third-color color filter layer respectively arranged on the penetration layer, the second-color quantum dot layer, and the third-color quantum dot layer.

Other aspects, features, and characteristics other than those described above will become apparent from the following detailed description, claims and drawings for carrying out the disclosure.

The general and specific aspects may be implemented by using a system, a method, a computer program, or any combination thereof.

BRIEF DESCRIPTION OF THE DRAWINGS

The above and other aspects, features, and characteristics of certain embodiments of the disclosure will be more apparent from the following description taken in conjunction with the accompanying drawings, in which.

DETAILED DESCRIPTION

Figure 1:
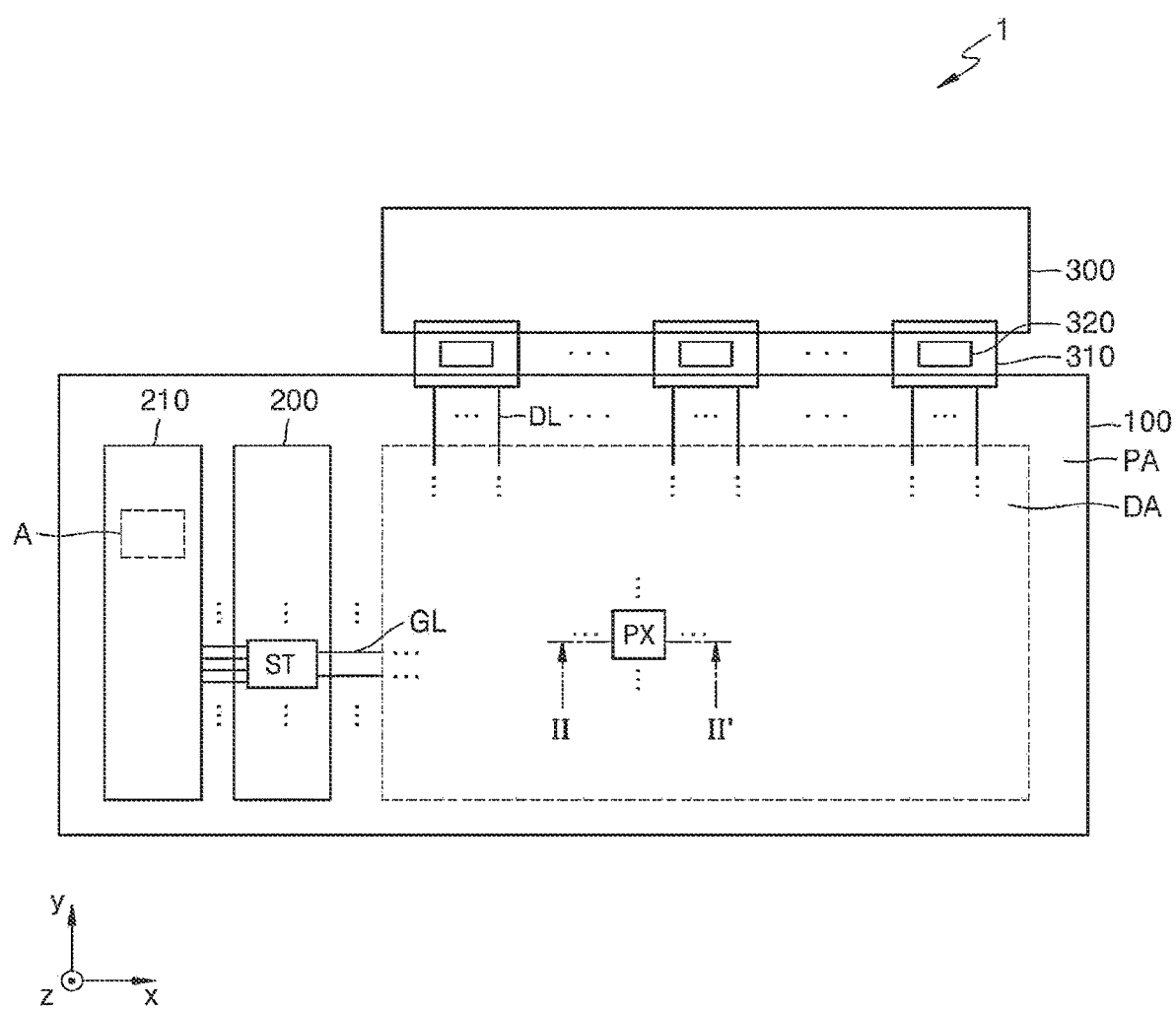
FIG. 1 is a schematic block diagram of a display apparatus according to some embodiments.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, particular embodiments will be illustrated in the drawings and described in detail in the written description. The attached drawings for illustrating aspects of some embodiments of the present disclosure are referred to in order to gain a sufficient understanding of the present disclosure, the merits thereof, and the objectives accomplished by the implementation of the present disclosure. The disclosure may, however, be embodied in many different forms and should not be construed as being limited to the embodiments set forth herein.

Hereinafter, the present disclosure will be described in more detail by explaining aspects of some embodiments of the present disclosure with reference to the attached drawings. Like reference numerals in the drawings denote like elements, and thus their descriptions will be omitted.

It will be understood that although the terms "first," "second," etc. may be used herein to describe various components, these components should not be limited by these terms. These components are only used to distinguish one component from another.

As used herein, the singular forms "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may be present.

Sizes of components in the drawings may be exaggerated for convenience of explanation. In other words, because sizes and thicknesses of components in the drawings are arbitrarily illustrated for convenience of explanation, the following embodiments are not limited thereto.

When certain embodiments may be implemented differently, a specific process order may be performed differently from the described order. For example, two consecutively described processes may be performed substantially at the same time or performed in an order opposite to the described order.

In the present specification, the expression "A and/or B" indicates A, B, or both A and B. The expression "at least one of A and B" indicates A, B, or both A and B.

It will be understood that when a layer, region, or component is referred to as being connected to another layer, region, or component, it can be directly and/or indirectly connected to the other layer, region, or component. That is, for example, intervening layers, regions, or components may be present. It will be understood that when a layer, region, or component is referred to as being electrically connected to another layer, region, or component, it can be electrically and directly and/or indirectly connected to the other layer, region, or component. That is, for example, intervening layers, regions, or components may be present.

In the following examples, the x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 is a schematic block diagram of a display apparatus according to some embodiments.

Referring to FIG. 1, a display apparatus 1 may include a substrate 100, a gate driver 200, a clock wire portion 210, a printed circuit board (PCB) 300, flexible PCBs (FPCBs) 310, and data drivers 320.

The substrate 100 may include a display area DA and a peripheral area PA on a periphery of the display area DA. The display area DA is an area where images are displayed, and a pixel PX including at least one thin film transistor and a light-emitting element may be arranged in the display area DA. The peripheral area PA is an area where no images are displayed, and gate lines GL, data lines DL, the gate driver 200, and the clock wire portion 210 for applying voltages, signals, and the like to the pixel PX in the display area DA may be arranged in the peripheral area PA.

One side of the peripheral area PA may be coupled to the FPCBs 310 and connected to the PCB 300. The data driver 320 mounted on the FPCB 310 may be configured to transmit a data signal (or a data voltage) to the pixel PX in the display area DA through the data line DL. As illustrated in FIG. 1, the gate line GL may extend in a first direction (e.g., a ±x direction) and be connected to the pixel PX in the display area DA, and the data line DL may extend in a second direction (e.g., a ±y direction) and be connected to the pixel PX in the display area DA.

The gate driver 200 may be arranged on one side of the peripheral area PA in the second direction (e.g., the ±y direction). The gate driver 200 may be integrated in the peripheral area PA. The gate driver 200 may include a plurality of stages ST for sequentially outputting gate signals to the gate lines GL. Each stage ST may be connected to at least one gate line GL and configured to transmit a gate signal to the pixel PX.

The clock wire portion 210 may be arranged on one side of the peripheral area PA in the second direction (e.g., the ±y direction). The clock wire portion 210 may be integrated in the peripheral area PA. The clock wire portion 210 may be configured to transmit a clock signal to the stage ST of the gate driver 200. For example, as described below with reference to FIG. 3, the clock wire portion 210 may include a carry clock signal line CR, a sensing clock signal line SS, a scan clock signal line SC, and a global clock signal line GB. The carry clock signal line CR may be configured to transmit a carry clock signal CLK_CR to the stage ST of the gate driver 200, the sensing clock signal line SS may be configured to transmit a sensing clock signal CLK_SS to the stage ST of the gate driver 200, the scan clock signal line SC may be configured to transmit a scan clock signal CLK_SC to the stage ST of the gate driver 200, and the global clock signal line GB may be configured to transmit a global clock signal CLK_GB to the stage ST of the gate driver 200.

The PCB 300 arranged on one side of the FPCB 310 may include a signal controller. The signal controller may generate various signals for displaying images in the display area DA and may be configured to transmit control signals to the gate driver 200, the clock wire portion 210, and the data driver 320 to control the same.

Figure 2:
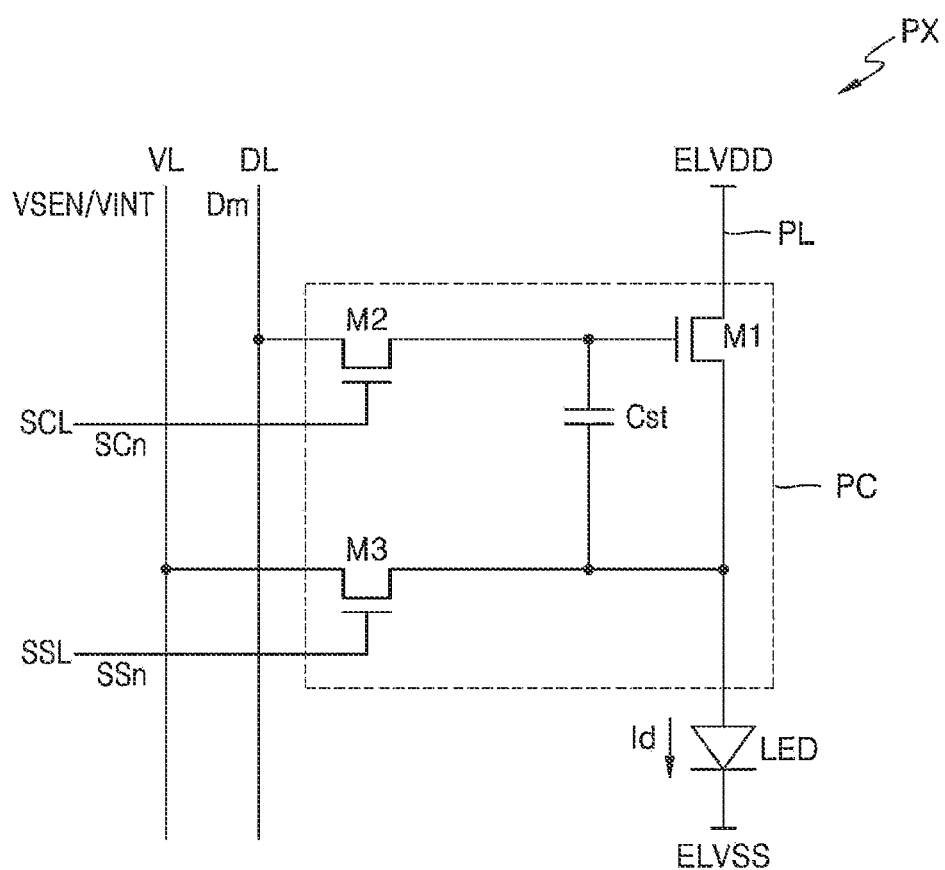
FIG. 2 is an equivalent circuit diagram of a pixel according to some embodiments.

FIG. 2 is an equivalent circuit diagram of a pixel according to some embodiments.

Referring to FIG. 2, the pixel PX may include a pixel circuit PC and a light-emitting diode LED electrically connected to the pixel circuit PC. The pixel circuit PC may be connected to a scan line SCL configured to transmit a scan signal SCn, a sensing line SSL configured to transmit a sensing signal SSn, sensing voltage line VL configured to transmit a sensing voltage VSEN or an initialization voltage VINT, a data line DL configured to transmit a data voltage Dm, and a driving power line PL configured to transmit a first driving voltage ELVDD. The pixel circuit PC may include a first transistor M1, a second transistor M2, a third transistor M3, and a storage capacitor Cst. The light-emitting diode LED may be an organic light-emitting diode OLED. A cathode of the light-emitting diode LED may be a common electrode to which a second driving voltage ELVSS is applied. The scan line SCL corresponds to some of the gate lines GL of FIG. 1, and the sensing line SSL corresponds others thereof of FIG. 1.

The first transistor M1 may be a driving transistor in which a size of a drain current is determined according to a gate-source voltage, and the second transistor M2 and the third transistor M3 may each be a switching transistor that is turned on/off according to the gate-source voltage, substantially, a gate voltage. The first transistor M1, the second transistor M2, and the third transistor M3 may each be a thin film transistor. The first transistor M1, the second transistor M2, and the third transistor M3 may each be an n-channel MOSFET (NMOS).

The first transistor M1, the second transistor M2, and the third transistor M3 may each be an oxide semiconductor thin film transistor including a semiconductor layer including an oxide semiconductor, or a silicon semiconductor thin film transistor including a semiconductor layer including polysilicon.

The first transistor M1 may be referred to as a driving transistor, the second transistor M2 may be referred to as a scan transistor, and the third transistor M3 may be referred to as a sensing transistor or an initialization transistor.

The storage capacitor Cst may be connected between a gate of the driving transistor M1 and an anode of the light-emitting diode LED. The storage capacitor Cst may include a first electrode connected to the gate of the driving transistor M1 and a second electrode connected to the anode of the light-emitting diode LED.

The driving transistor M1 may be configured to control a size of a driving current Id flowing from the driving power line PL to the light-emitting diode LED according to the gate-source voltage. The light-emitting diode LED may emit light having a certain brightness because of the driving current Id. The driving transistor T1 may include a gate connected to the first electrode of the storage capacitor Cst, a drain connected to the driving power line PL, and a source connected to the light-emitting diode LED.

The scan transistor M2 may connect the data line DL to the driving transistor M1 in response to a scan signal SCn. The scan transistor M2 may be configured to transmit a data voltage Dm to the driving transistor M1 in response to a scan signal SCn. For example, the scan transistor M2 may connect the data line DL to the gate of the driving transistor M1 in response to the scan signal SCn. The scan transistor M2 may be configured to transmit the data voltage Dm to the gate of the driving transistor M1 in response to the scan signal SCn.

The sensing transistor M3 may connect the sensing voltage line VL to the anode of the light-emitting diode LED in response to the sensing signal SSn. The sensing transistor M3 may be configured to transmit the sensing voltage VSEN or the initialization voltage VINT to the anode of the light-emitting diode LED in response to the sensing signal SSn.

FIG. 2 shows the driving transistor M1, the scan transistor M2, and the sensing transistor M3 each are an NMOS, but one or more embodiments are not limited thereto. For example, at least one of the driving transistor M1, the scan transistor M2, or the sensing transistor M3 may be a PMOS.

FIG. 2 shows that the pixel circuit PC includes three transistors and one storage capacitor, but one or more embodiments are not limited thereto. For example, the pixel circuit PC may include seven transistors and one storage capacitor.

Figure 3:
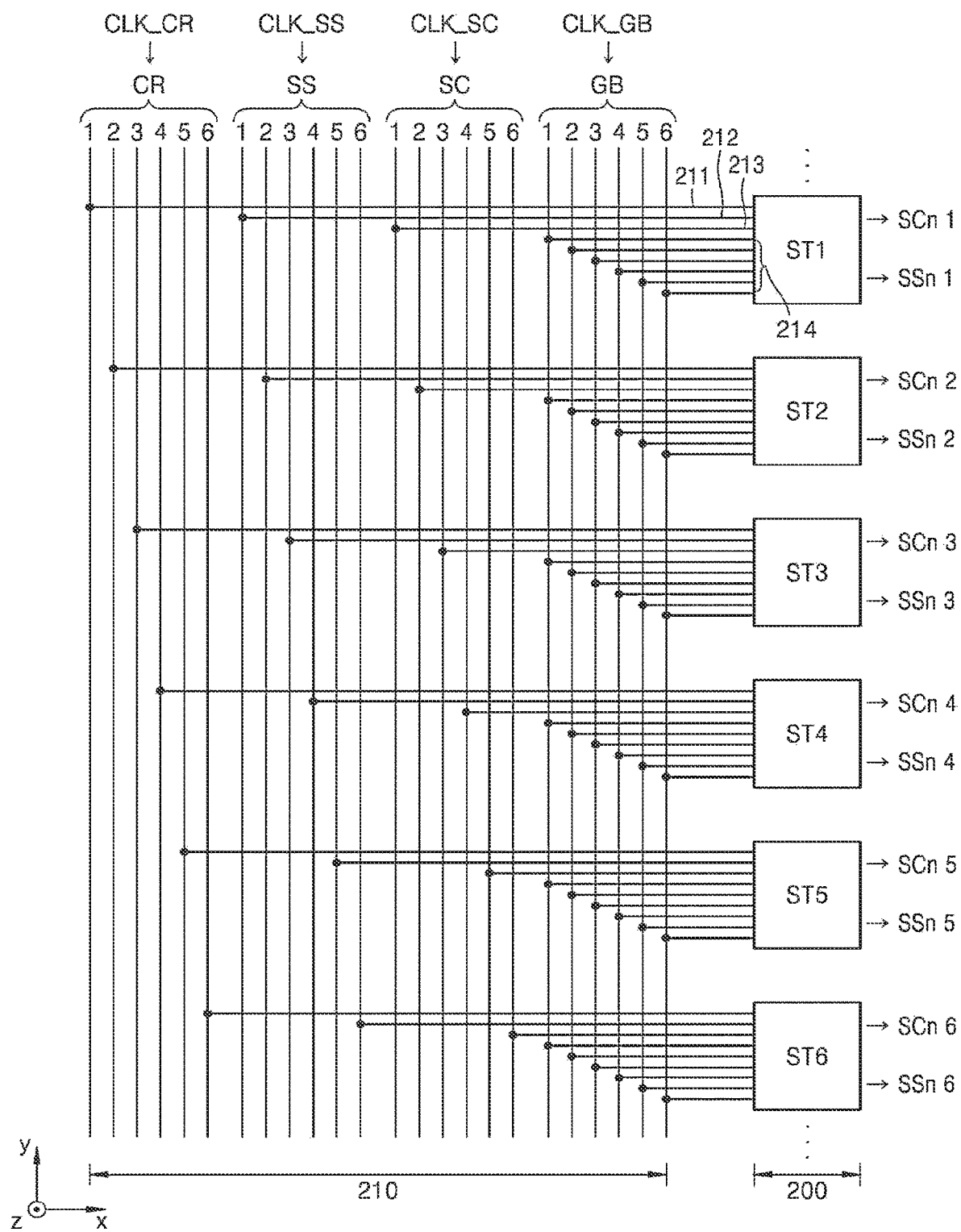
FIG. 3 is a schematic block diagram of a clock wire portion and a gate driver, according to some embodiments.

FIG. 3 is a schematic block diagram of a clock wire portion and a gate driver, according to some embodiments.

Referring to FIG. 3, the clock wire portion 210 may include a plurality of carry clock signal lines CR, a plurality of sensing clock signal lines SS, a plurality of scan clock signal lines SC, and a plurality of global clock signal lines GB. The carry clock signal lines CR, the sensing clock signal lines SS, the scan clock signal lines SC, and the global clock signal lines GB may extend in the second direction (e.g., the ±y direction), respectively.

The sensing clock signal lines SS may be arranged on the right side of the carry clock signal lines CR, the scan clock signal lines SC may be arranged on the right side of the sensing clock signal lines SS, and the global clock signal lines GB may be arranged on the right side of the scan clock signal lines SC. According to some embodiments, locations of the carry clock signal lines CR, the sensing clock signal lines SS, the scan clock signal lines SC, and the global clock signal lines GB may change. FIG. 3 shows that the clock wire portion 210 includes six carry clock signal lines CR, six sensing clock signal lines SS, six scan clock signal lines SC, and six global clock signal lines GB, but the number of each of the aforementioned signal lines may vary.

For convenience of explanation, FIG. 3 shows first to sixth carry clock signal lines CR1 to CR6 by using the reference character CR with reference numbers 1 to 6, and the same applies to the sensing clock signal lines SS, the scan clock signal lines SC, and the global clock signal lines GB, for example, first to sixth sensing clock signal lines SS1 to SS6, first to sixth scan clock signal lines SC1 to SC6, and first to sixth global clock signal lines GB1 to GB6.

The first to sixth carry clock signal lines CR1 to CR6 may be arranged at regular intervals. The first carry clock signal line CR1 may be electrically connected to a carry clock signal connection line 211 extending in the first direction (e.g., the ±x direction). The carry clock signal connection line 211 may be connected to the first stage ST1 and configured to transmit a first carry clock signal CLK_CR1 from the first carry clock signal line CR1 to the first stage ST1. The embodiments are described based on the first carry clock signal line CR1, but the same description may be applied to the second to sixth carry clock signal lines CR2 to CR6. For example, as shown in FIG. 3, the second carry clock signal line CR2 may be configured to transmit a second carry clock signal CLK_CR2 to the second stage ST2 through the carry clock signal connection line 211. The third carry clock signal line CR3 may be configured to transmit a third carry clock signal CLK_CR3 to the third stage ST3 through the carry clock signal connection line 211. The fourth carry clock signal line CR4 may be configured to transmit a fourth carry clock signal CLK_CR4 to the fourth stage ST4 through the carry clock signal connection line 211. The fifth carry clock signal CR5 may be configured to transmit a fifth carry clock signal CLK_CR5 to the fifth stage ST5 through the carry clock signal connection line 211. The sixth carry clock signal CR6 may be configured to transmit a sixth carry clock signal CLK_CR6 to the sixth stage ST6 through the carry clock signal connection line 211.

The first to sixth sensing clock signal lines SS1 to SS6 may be arranged at regular intervals. The first sensing clock signal line SS1 may be electrically connected to a sensing clock signal connection line 212 extending in the first direction (e.g., the ±x direction). The sensing clock signal connection line 212 may be connected to the first stage ST1 and configured to transmit, to the first stage ST1, the first sensing clock signal CLK_SS1 from the first sensing clock signal line SS1. The embodiments are described based on the first sensing clock signal line SS1, but the same description may be applied to the second to sixth sensing clock signal lines SS2 to SS6. For example, as shown in FIG. 3, the second sensing clock signal line SS2 may be configured to transmit a second sensing clock signal CLK_SS2 to the second stage ST2 through the second sensing clock signal line SS2. The third sensing clock signal line SS3 may be configured to transmit a third sensing clock signal CLK_SS3 to the third stage ST3 through the sensing clock signal connection line 212. The fourth sensing clock signal line SS4 may be configured to transmit a fourth sensing clock signal CLK_SS4 to the fourth stage ST4 through the sensing clock signal connection line 212. The fifth sensing clock signal line SS5 may be configured to transmit a fifth sensing clock signal CLK_SS5 to the fifth stage ST5 through the sensing clock signal connection line 212. The sixth sensing clock signal line SS6 may be configured to transmit a sixth sensing clock signal CLK_SS6 to the sixth stage ST6 through the sensing clock signal connection line 212.

The first scan clock signal line SC1 to the sixth scan clock signal line SC6 may be arranged at regular intervals. The first scan clock signal line SC1 may be electrically connected to a scan clock signal connection line 213 extending in the first direction (e.g., the ±x direction). The scan clock signal connection line 213 may be connected to the first stage ST1 and configured to transmit, to the first stage ST1, a first scan clock signal CLK_SC1 from the first scan clock signal line SC1. The embodiments are described based on the first scan clock signal line SC1, but the same description may be applied to the second scan clock signal line SC2 to the sixth scan clock signal line SC6. For example, as shown in FIG. 3, the second scan clock signal line SC2 may be configured to transmit a second scan clock signal CLK_SC2 to the second stage ST2 through the scan clock signal connection line 213. The third scan clock signal line SC3 may be configured to transmit a third scan clock signal CLK_SC3 to the third stage ST3 through the scan clock signal connection line 213. The fourth scan clock signal line SC4 may be configured to transmit a fourth scan clock signal CLK_SC4 to the fourth stage ST4 through the scan clock signal connection line 213. The fifth scan clock signal line SC5 may be configured to transmit a fifth scan clock signal CLK_SC5 to the fifth stage ST5 through the scan clock signal connection line 213. The sixth scan clock signal line SC6 may be configured to transmit a sixth scan clock signal CLK_SC6 to the sixth stage ST6 through the scan clock signal connection line 213.

The first global clock signal line GB1 to the sixth global clock signal line GB6 may be arranged at regular intervals. The first global clock signal line GB1 to the sixth global clock signal line GB6 may be electrically connected to six global clock signal connection lines 214 extending in the first direction (e.g., the ±x direction), respectively, and may be configured to transmit a first global clock signal CLK_GB1 to a sixth global clock signal CLK_GB6 to the first stage ST1. The embodiments are described based on the first stage ST1, but the same description may be applied to the second stage ST2 to the sixth stage ST6.

Each of the first stage ST1 to the sixth stage ST6 of the gate driver 200 may be connected to the carry clock signal line CR, the sensing clock signal line SS, the scan clock signal line SC, and six global clock signal lines GB1 to GB6. That is, for example, nine clock signals may be applied to one stage. Each stage may output a scan signal SCn (see FIG. 2) and a sensing signal SSn (see FIG. 2) in response to nine clock signals. For example, the first carry clock signal CLK_CR1, the first sensing clock signal CLK_SS1, the first scan clock signal CLK_SC1, and the first global clock signal CLK_GB1 to the sixth global clock signal CLK_GB6 may be applied to the first stage ST1, and the first stage ST1 may output a first scan signal SCn1 and a first sensing signal SSn1 in response to at least one of the clock signals applied to the first stage ST1. The first stage ST1 may output the first scan signal SCn1 in response to the first scan clock signal CLK_SC1 and the first sensing signal SSn1 in response to the first sensing clock signal CLK_SS1. The second carry clock signal CLK_CR2, the second sensing clock signal CLK_SS2, the second scan clock signal CLK_SC2, and the first global clock signal CLK_GB1 to the sixth global clock signal CLK_GB6 may be applied to the second stage ST2, and the second stage ST2 may output a second scan signal SCn2 and a second sensing signal SSn2 in response to at least one of the clock signals applied to the second stage ST2. The second stage ST2 may output the second scan signal SCn2 in response to the second scan clock signal CLK_SC2 and the second sensing signal SSn2 in response to the second sensing clock signal CLK_SS2. The third carry clock signal CLK_CR3, the third sensing clock signal CLK_SS3, the third scan clock signal CLK_SC3, and the first global clock signal CLK_GB1 to the sixth global clock signal CLK_GB6 may be applied to the third stage ST3, and the third stage ST3 may output a third scan signal SCn3 and a third sensing signal SSn3 in response to at least one of the clock signals applied to the third stage ST3. The third stage ST3 may output the third scan signal SCn3 in response to the third scan clock signal CLK_SC3 and the third sensing signal SSn3 in response to the third sensing clock signal CLK_SS3. The fourth carry clock signal CLK_CR4, the fourth sensing clock signal CLK_SS4, the fourth scan clock signal CLK_SC4, and the first global clock signal CLK_GB1 to the sixth global clock signal CLK_GB6 may be applied to the fourth stage ST4, and the fourth stage ST4 may output a fourth scan signal SCn4 and a fourth sensing signal SSn4 in response to at least one of the clock signals applied to the fourth stage ST4. The fourth stage ST4 may output the fourth scan signal SCn4 in response to the fourth scan clock signal CLK_SC4 and the fourth sensing signal SSn4 in response to the fourth sensing clock signal CLK_SS4. The fifth carry clock signal CLK_CR5, the fifth sensing clock signal CLK_SS5, the fifth scan clock signal CLK_SC5, and the first global clock signal CLK_GB1 to the sixth global clock signal CLK_GB6 may be applied to the fifth stage ST5, and the fifth stage ST5 may output a fifth scan signal SCn5 and a fifth sensing signal SSn5 in response to at least one of the clock signals applied to the fifth stage ST5. The fifth stage ST5 may output the fifth scan signal SCn5 in response to the fifth scan clock signal CLK_SC5 and the fifth sensing signal SSn5 in response to the fifth sensing clock signal CLK_SS5. The sixth carry clock signal CLK_CR6, the sixth sensing clock signal CLK_SS6, the sixth scan clock signal CLK_SC6, and the first global clock signal CLK_GB1 to the sixth global clock signal CLK_GB6 may be applied to the sixth stage ST6, and the sixth stage ST6 may output a sixth scan signal SCn6 and a sixth sensing signal SSn6 in response to at least one of the clock signals applied to the sixth stage ST6. The sixth stage ST6 may output the sixth scan signal SCn6 in response to the sixth scan clock signal CLK_SC6 and the sixth sensing signal SSn6 in response to the sixth sensing clock signal CLK_SS6.

Figure 4:
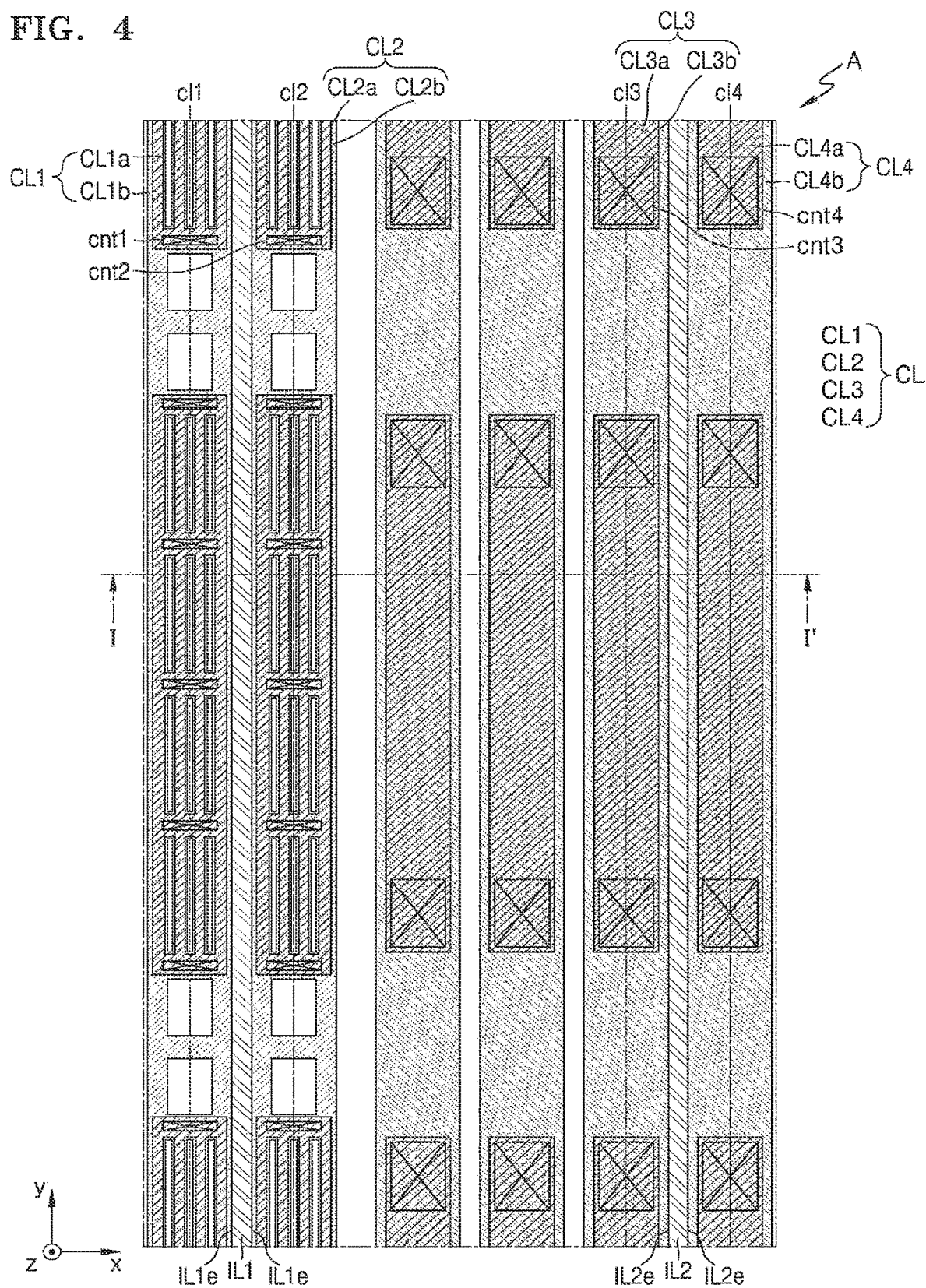
FIG. 4 is a schematic enlarged view of a portion of a display apparatus, according to some embodiments.

FIG. 4 is a schematic enlarged view of a portion of a display apparatus, according to some embodiments.

Referring to FIG. 4, the display apparatus 1 (see FIG. 1) may include a plurality of conductive lines CL, a first insulating line IL1, and a second insulating line IL2 arranged on one side of the peripheral area PA (see FIG. 1).

The conductive lines CL may be arranged in the first direction (e.g., the ±x direction) and extend in the second direction (e.g., the ±y direction). The conductive lines CL may correspond to the clock signal lines of FIG. 3. For example, the first conductive line CL1 and the second conductive line CL2 may correspond to the scan clock signal lines SC of FIG. 3, and the third conductive line CL3 and the fourth conductive line CL4 may correspond to the sensing clock signal lines SS of FIG. 3. Some of the scan signals SCn (see FIG. 2) may be respectively output in response to the scan clock signals CLK_SC (see FIG. 3) transmitted through the first conductive line CL1 and the second conductive line CL2, and some of the sensing signals SSn (see FIG. 2) may be respectively output in response to the sensing clock signals CLK_SS (see FIG. 3) transmitted through the third conductive line CL3 and the fourth conductive line CL4.

Each of the conductive lines CL may include a lower conductive line and an upper conductive line electrically connected to the lower conductive line. The lower conductive line may overlap the upper conductive line. For example, the first conductive line CL1 may include a first lower conductive line CL1a and a first upper conductive line CL1b, and the first lower conductive line CL1a may be connected to the first upper conductive line CL1b through a first contact hole cnt1. The second conductive line CL2 may include a second lower conductive line CL2a and a second upper conductive line CL2b, and the second lower conductive line CL2a may be connected to the second upper conductive line CL2b through a second contact hole cnt2. The third conductive line CL3 may include a third lower conductive line CL3a and a third upper conductive line CL3b, and the third lower conductive line CL3a may be connected to the third upper conductive line CL3b through a third contact hole cnt3. The fourth conductive line CL4 may include a fourth lower conductive line CL4a and a fourth upper conductive line CL4b, and the fourth lower conductive line CL4a may be connected to the fourth upper conductive line CL4b through a fourth contact hole cnt4.

The lower conductive line of each conductive line CL may be provided in plural. The lower conductive lines may be arranged apart from each other in the second direction (e.g., the ±y direction) and overlap the upper conductive line. For example, the first lower conductive line CL1a of the first conductive line CL1 may be provided in plural. The first lower conductive lines CL1a may be arranged apart from each other in the second direction (e.g., the ±y direction) and overlap the first upper conductive line CL1b. The second lower conductive line CL2a of the second conductive line CL2 may be provided in plural. The second lower conductive lines CL2a may be arranged apart from each other in the second direction (e.g., the ±y direction) and overlap the second upper conductive line CL2b. The third lower conductive line CL3a of the third conductive line CL3 may be provided in plural. The third lower conductive lines CL3a may be arranged apart from each other in the second direction (e.g., the ±y direction) and overlap the third upper conductive line CL3b. The fourth lower conductive line CL4a of the fourth conductive line CL4 may be provided in plural. The fourth lower conductive lines CL4a may be arranged apart from each other in the second direction (e.g., the ±y direction) and overlap the fourth upper conductive line CL4b.

The first insulating line IL1 and the second insulating line IL2 may be respectively arranged between neighboring ones of the conductive lines CL and may extend in the second direction (e.g., the ±y direction). For example, the first insulating line IL1 may be arranged between the first conductive line CL1 and the second conductive line CL2 that are adjacent to each other from among the conductive lines CL, and the second insulating line IL2 may be arranged between the third conductive line CL3 and the fourth conductive line CL4 that are adjacent to each other from among the conductive lines CL. First edges IL1e on both sides of the first insulating line IL1 extending in the second direction (e.g., the ±y direction) may be located between a first center line cl1 of the first conductive line CL1 and a second center line cl2 of the second conductive line CL2 that are in the second direction (e.g., the ±y direction). Second edges IL2e on both sides of the second insulating line IL2 extending in the second direction (e.g., the ±y direction) may be located between a third center line cl3 of the third conductive line CL3 and a fourth center line cl4 of the fourth conductive line CL4 that are in the second direction (e.g., the ±y direction).

Figure 16:
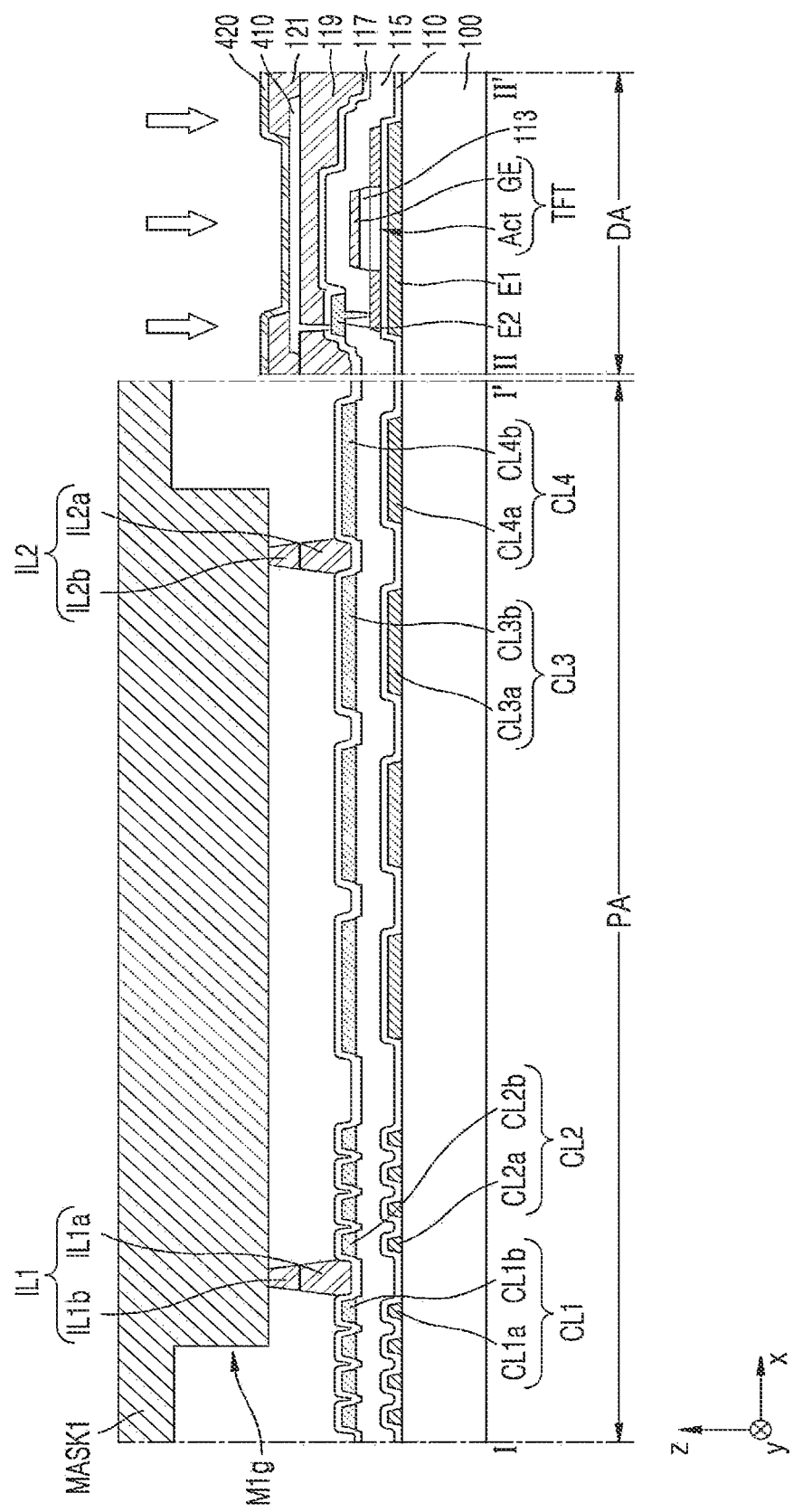
FIG. 16 is a schematic cross-sectional view of a method of manufacturing a display apparatus, according to some embodiments.
Figure 17:
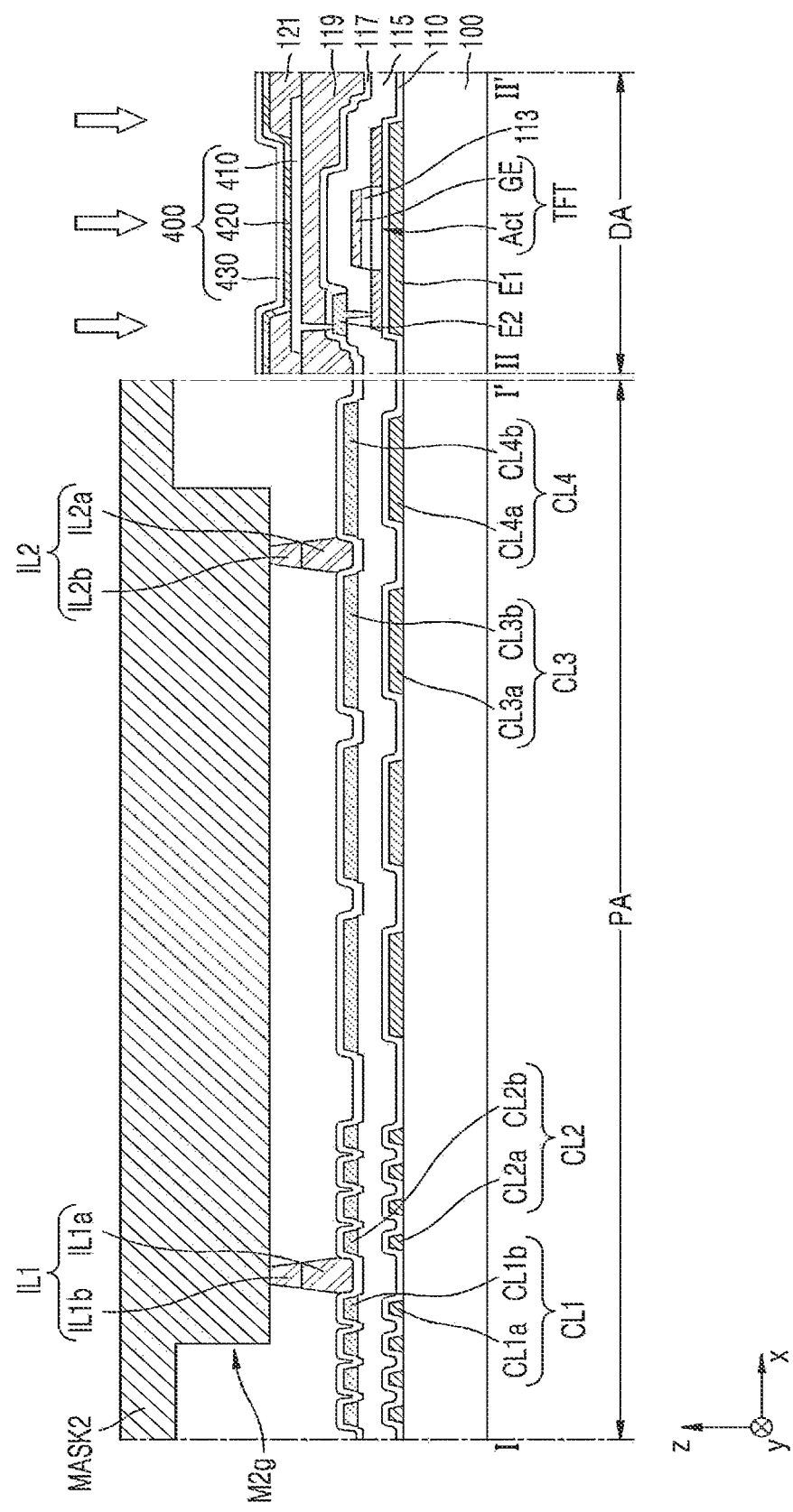
FIG. 17 is a schematic cross-sectional view of a method of manufacturing a display apparatus, according to some embodiments.
Figure 18:
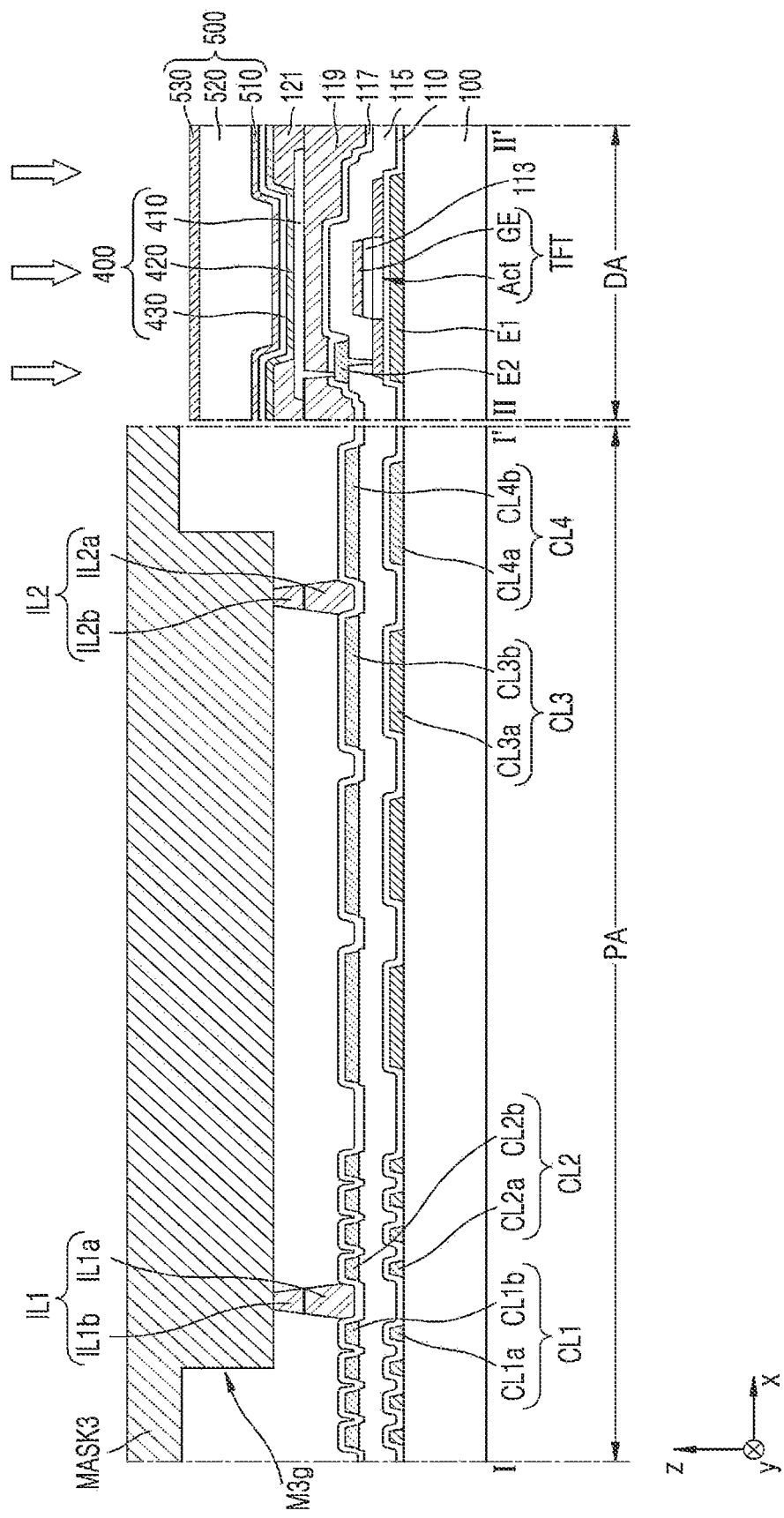
FIG. 18 is a schematic cross-sectional view of a method of manufacturing a display apparatus, according to some embodiments.

The first insulating line IL1 and the second insulating line IL2 may function as supports that support a first mask MASK1 used when an emission layer 420 is formed as shown in FIG. 16 below. The first insulating line IL1 and the second insulating line IL2 may function as supports that support a second mask MASK2 used when an opposite electrode 430 is formed as shown in FIG. 17 below. The first insulating line IL1 and the second insulating line IL2 may function as supports that support a third mask MASK3 used to form an encapsulation layer 500, as shown in FIG. 18 below.

The first insulating line IL1 and the second insulating line IL2, which function as the supports, may include organic materials. When external air introduced from the outside of the display apparatus 1 penetrates the first insulating line IL1 and the second insulating line IL2 that include organic materials, dielectric constants of the first insulating line IL1 and the second insulating line IL2 may change. A deviation in signal delay may be generated between conductive lines CL, which overlap the first and second insulating lines IL1 and IL2 having changed dielectric constants, and conductive lines CL, which do not overlap the above first and the second insulating lines IL1 and IL2, and horizontal irregularity may be caused by the deviation in the signal delay. An area where the first insulating line IL1 and the second insulating line IL2 overlap the conductive lines CL may decrease because the first insulating line IL1 and the second insulating line IL2 are arranged between the conductive lines CL, and thus, the deviation in the signal delay may decrease, and the horizontal irregularity resulting from the deviation may be prevented or reduced.

Figure 5:
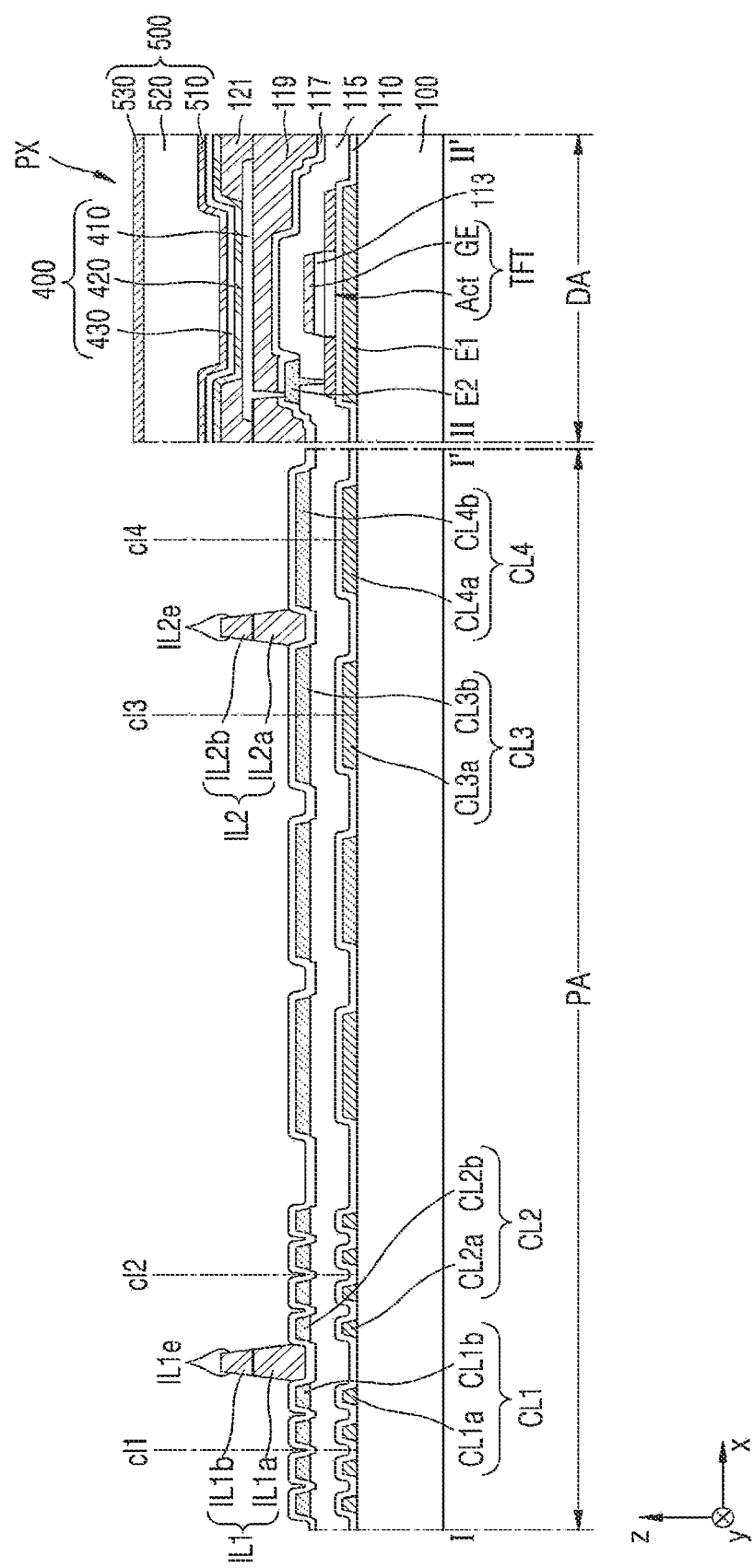
FIG. 5 is an example cross-sectional view showing conductive lines and insulating lines of FIG. 4 and the pixel of FIG. 1, taken along the lines I-I' and II-II', respectively.

FIG. 5 is an example cross-sectional view showing the conductive lines and the insulating lines of FIG. 4 and the pixel of FIG. 1, taken along line I-I' and II-II', respectively.

Referring to FIG. 5, the display apparatus 1 (see FIG. 1) may include the conductive lines CL (see FIG. 4), the first insulating line IL1, and the second insulating line IL2 arranged in the peripheral area PA, and the pixel PX arranged in the display area DA.

As described above with reference to FIG. 4, each conductive line CL may include a lower conductive line and an upper conductive line electrically connected thereto. The lower conductive line may overlap the upper conductive line. For example, the first conductive line CL1 may include the first lower conductive line CL1a and the first upper conductive line CL1b overlapping each other, the second conductive line CL2 may include the second lower conductive line CL2a and the second upper conductive line CL2b overlapping each other, the third conductive line CL3 may include the third lower conductive line CL3a and the third upper conductive line CL3b overlapping each other, and the fourth conductive line CL4 may include the fourth lower conductive line CL4a and the fourth upper conductive line CL4b overlapping each other.

The first insulating line IL1 may be arranged between the first conductive line CL1 and the second conductive line CL2, and the second insulating line IL2 may be arranged between the third conductive line CL3 and the fourth conductive line CL4. The first edges IL1e on both sides of the first insulating line IL1 may be arranged between the first center line cl1 of the first conductive line CL1 and the second center line cl2 of the second conductive line CL2, and the second edges IL2e on both sides of the second insulating line IL2 may be located between the third center line cl3 of the third conductive line CL3 and the fourth center line cl4 of the fourth conductive line CL4.

The first insulating line IL1 may include a first lower insulating line IL1a and a first upper insulating line IL1b, and the second insulating line IL2 may include a second lower insulating line IL2a and a second upper insulating line IL2b. FIG. 5 shows that the first insulating line IL1 and the second insulating line IL2 each have a multilayered structure, but according to some embodiments, the first insulating line IL1 and the second insulating line IL2 may each have a single-layer structure. For example, the first upper insulating line IL1b and the second upper insulating line IL2b may be omitted.

The pixel PX may include a thin film transistor TFT and a light-emitting element 400 electrically connected to the thin film transistor TFT. The thin film transistor TFT may include a semiconductor layer Act and a gate electrode GE, and the light-emitting element 400 may include a pixel electrode 410, the emission layer 420, and the opposite electrode 430.

Hereinafter, configurations included in the display apparatus 1 are described in detail according to the stack structure with reference to FIG. 5.

The substrate 100 may include a glass material, a ceramic material, a metallic material, or a flexible or bendable material. The substrate 100 may have a single-layer structure or a multilayered structure, and in the case of the multilayered structure, the substrate 100 may further include an inorganic layer. In some embodiments, the substrate 100 may have a structure of organic/inorganic/organic materials.

A buffer layer 110 may decrease or prevent or reduce the penetration of foreign materials, contaminants, moisture, or external air from the bottom of the substrate 100 and provide a flat surface on the substrate 100. The buffer layer 110 may include an inorganic material such as oxide or nitride, an organic material, or a compound of organic and inorganic materials and have a single-layer structure or a multilayered structure including organic and inorganic materials.

The semiconductor layer Act may be arranged on the buffer layer 110. The semiconductor layer Act may include an oxide semiconductor material. The semiconductor layer Act may include, for example, oxide of at least one material selected from the group consisting of indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn).

For example, the semiconductor layer Act may be an InSnZnO (ITZO) semiconductor layer, an InGaZnO (IGZO) semiconductor layer, or the like. Because the oxide semiconductor has a wide band gap (about 3.1 eV), high carrier mobility, and a low leakage current, a voltage drop may not be great despite a long operation time, and thus, a brightness change according to the voltage drop may not be great even during operation in a low frequency.

The semiconductor layer Act may include a channel area and a source area and a drain area that are on one side and the other side of the channel area. The semiconductor layer Act may be a layer or layers.

The first lower conductive line CL1a, the second lower conductive line CL2a, the third lower conductive line CL3a, the fourth lower conductive line CL4a, and a first electrode E1 may be arranged between the substrate 100 and the buffer layer 110. The first lower conductive line CL1a and the second lower conductive line CL2a may have an opening (or a hole) through which at least a portion of the substrate 100 is exposed. The first electrode E1 may be arranged to overlap the channel area of the semiconductor layer Act. The first lower conductive line CL1a, the second lower conductive line CL2a, the third lower conductive line CL3a, the fourth lower conductive line CL4a, and the first electrode E1 may each include conductive materials including molybdenum (Mo), aluminum (Al), copper (Cu), and titanium (Ti) and may each be a layer or layers including the above materials. For example, the first lower conductive line CL1a, the second lower conductive line CL2a, the third lower conductive line CL3a, the fourth lower conductive line CL4a, and the first electrode E1 may each have a multilayered structure of Ti/Al/Ti.

The first electrode E1 may be arranged to overlap the semiconductor layer Act including an oxide semiconductor material. Because the semiconductor layer Act including an oxide semiconductor material is vulnerable to light, the first electrode E1 may prevent or reduce instances of device characteristics of the thin film transistor TFT, which includes the oxide semiconductor material, changing because of photocurrents generated in the semiconductor layer Act due to external light that is incident from the substrate 100.

A gate insulating layer 113 may be arranged on the semiconductor layer Act. The gate insulating layer 113 may include silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like.

As shown in FIG. 5, the gate insulating layer 113 may be patterned to overlap a portion of the semiconductor layer Act. That is, the gate insulating layer 113 may be patterned to expose the source area and the drain area of the semiconductor layer Act.

An area where the gate insulating layer 113 overlaps the semiconductor layer Act may be understood as a channel area of the semiconductor layer Act. A conducting process according to plasma treatment may be performed on the source area and the drain area, and in this case, a portion of the semiconductor layer Act, which overlaps the gate insulating layer 113, (that is, the channel area) may have different properties from the source area and the drain area because the channel area is not exposed to the plasma treatment. That is, when the plasma treatment is performed on the semiconductor layer Act, the gate electrode GE arranged on the gate insulating layer 113 may be used as a self-alignment mask to form the channel area, on which the plasma treatment is not performed, at a location where the semiconductor layer Act overlaps the gate insulating layer 113, and on both sides of the channel area, the source area and the drain area, on which the plasma treatment is performed, may be formed.

According to some embodiments, the gate insulating layer 113 may not be patterned to overlap a portion of the semiconductor layer Act and may be arranged on the entire substrate 100 to cover the semiconductor layer Act.

On the gate insulating layer 113, the gate electrode GE may be arranged to at least partially overlap the semiconductor layer Act. The gate electrode GE may be a layer or layers including one or more metals selected from among aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

An interlayer insulating layer 115 may be arranged to cover the semiconductor layer Act and the gate electrode GE. The interlayer insulating layer 115 may include $SiO_x$, $SiN_x$, SiON, $Al_2O_3$, $TiO_2$, $Ta_2O_5$, $HfO_2$, $ZnO_2$, or the like.

On the interlayer insulating layer 115, the first upper conductive line CL1b, the second upper conductive line CL2b, the third upper conductive line CL3b, the fourth upper conductive line CL4b, and a second electrode E2 may be arranged. The first upper conductive line CL1b, the second upper conductive line CL2b, the third upper conductive line CL3b, the fourth upper conductive line CL4b, and the second electrode E2 may each include conductive materials including Mo, Al, Cu, Ti, and the like and may be a layer or layers including the above materials. For example, the first upper conductive line CL1b, the second upper conductive line CL2b, the third upper conductive line CL3b, the fourth upper conductive line CL4b, and the second electrode E2 may each have a multilayered structure of Ti/Al/Ti.

According to some embodiments, the first upper conductive line CL1b may contact the first lower conductive line CL1a through the first contact hole cnt1 (see FIG. 4), the second upper conductive line CL2b may contact the second lower conductive line CL2a through the second contact hole cnt2 (see FIG. 4), the third upper conductive line CL3b may contact the third lower conductive line CL3a through the third contact hole cnt3 (see FIG. 4), and the fourth upper conductive line CL4b may contact the fourth lower conductive line CL4a through the fourth contact hole cnt4 (see FIG. 4). The first contact hole cnt1 to the fourth contact hole cnt4 may be formed in the buffer layer 110 and the interlayer insulating layer 115.

The second electrode E2 may contact the source area or the drain area of the semiconductor layer Act through a contact hole formed in the interlayer insulating layer 115.

The first upper conductive line CL1b, the second upper conductive line CL2b, the third upper conductive line CL3b, the fourth upper conductive line CL4b, and the second electrode E2 may be covered by a passivation layer 117. The passivation layer 117 may be an inorganic insulating layer including an inorganic material. The inorganic material may include polysiloxane, $SiN_x$, $SiO_x$, SiON, or the like. Also, the passivation layer 117 may be a layer or layers including the above materials. For example, the passivation layer 117 may be a layer or layers including $SiN_x$ and $SiO_x$. The passivation layer 117 may be arranged to cover some lines arranged on the interlayer insulating layer 115 and protect the same.

On the passivation layer 117, the first lower insulating line IL1a, the second lower insulating line IL2a, and a planarization layer 119 may be arranged. The planarization layer 119 may include a contact hole configured to connect the thin film transistor TFT to the pixel electrode 410.

The first lower insulating line IL1a, the second lower insulating line IL2a, and the planarization layer 119 may each be a layer or layers including organic materials and provide a flat upper surface. The first lower insulating line IL1a, the second lower insulating line IL2a, and the planarization layer 119 may each include a general-purpose polymer such as benzocyclobutene (BCB), polyimide, hexamethyldisiloxane (HMDSO), polymethylmethacrylate (PMMA), or polystyrene (PS), a polymer derivative having a phenol-based group, an acryl-based polymer, an imide-based polymer, an aryl-ether-based polymer, an amide-based polymer, a fluorine-based polymer, a p-xylene-based polymer, a vinyl alcohol-based polymer, and any blend thereof.

The light-emitting element 400 may be arranged on the planarization layer 119, and the light-emitting element 400 may include the pixel electrode 410, the emission layer 420, and the opposite electrode 430.

The pixel electrode 410 may be a (semi-)light-transmissive electrode or a reflection electrode. In some embodiments, the pixel electrode 410 may include a reflection layer including Ag, Mg, Al, Pt, Pd, Au, Ni, Nd, Ir, Cr, or a combination thereof, and a transparent or translucent electrode layer formed on the reflection layer. The transparent or translucent electrode layer may include at least one material selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). In some embodiments, the pixel electrode 410 may be a tri-layer. For example, the try-layer of the pixel electrode 410 may include ITO/Ag/ITO.

The first upper insulating line IL1b may be arranged on the first lower insulating line IL1a, the second upper insulating line IL2b may be arranged on the second lower insulating line IL2a, and a pixel-defining layer 121 may be arranged on the planarization layer 119. The pixel-defining layer 121 may cover edges of the pixel electrode 410 and have an opening exposing part of the pixel electrode 410. The pixel-defining layer 121 may increase a distance between the edge of the pixel electrode 410 and the opposite electrode 430 arranged on the pixel electrode 410 and thus may prevent or reduce arcs, etc. from being generated on the edge of the pixel electrode 410.

The first upper insulating line IL1b, the second upper insulating line IL2b, and the pixel-defining layer 121 may each include one or more organic insulating materials selected from the group consisting of polyimide, polyamide, acrylic resin, BCB, and phenol resin and may be formed according to a spin coating method, etc.

The emission layer 420 may be arranged on the pixel electrode 410 and the pixel-defining layer 121 and may include an organic emission layer. The organic emission layer may include an organic material including a fluorescent or phosphorescent material emitting red light, green light, blue light, or white light. The organic emission layer may include a low-molecular-weight or a high-molecular-weight organic material, and on and under the organic emission layer, functional layers such as a hole transport layer (HTL), a hole injection layer (HIL), an electron transport layer (ETL), and an electron injection layer (EIL) may be selectively arranged.

The opposite electrode 430 may be a light-transmissive electrode or a reflection electrode. In some embodiments, the opposite electrode 430 may be a transparent or translucent electrode and may include a metal thin-film having a low work function and including Li, Ca, LiF/Ca, LiF/Al, Al, Ag, Mg, and a compound thereof. Also, a transparent conductive oxide (TCO) layer including ITO, IZO, ZnO, or $In_2O_3$ may be further arranged on the metal thin-film. The opposite electrode 430 may be arranged over the display area DA and arranged on the emission layer 420 and the pixel-defining layer 121. The opposite electrode 430 may be integrally formed over the light-emitting elements 400, thus corresponding to the pixel electrodes 410.

The light-emitting element 400 including an organic emission layer may be easily damaged by external moisture, oxygen, etc., and thus, the encapsulation layer 500 may cover and protect the light-emitting element 400. The encapsulation layer 500 may be arranged on the opposite electrode 430 and extend to at least a portion of the peripheral area PA while covering the display area DA. The encapsulation layer 500 may include a first inorganic encapsulation layer 510, an organic encapsulation layer 520, and a second inorganic encapsulation layer 530. The first inorganic encapsulation layer 510 and the second inorganic encapsulation layer 530 may each include one or more inorganic materials selected from among $Al_2O_3$, $TiO_2$, $Ta_2O_5$, $HfO_2$, $ZnO_2$, $SiO_x$, $SiN_x$, and SiON. The organic encapsulation layer 520 may include a polymer-based material. The polymer-based material may include acrylic resin, epoxy-based resin, polyimide, polyethylene, and the like. According to some embodiments, the organic encapsulation layer 520 may include acrylate.

Figure 6:
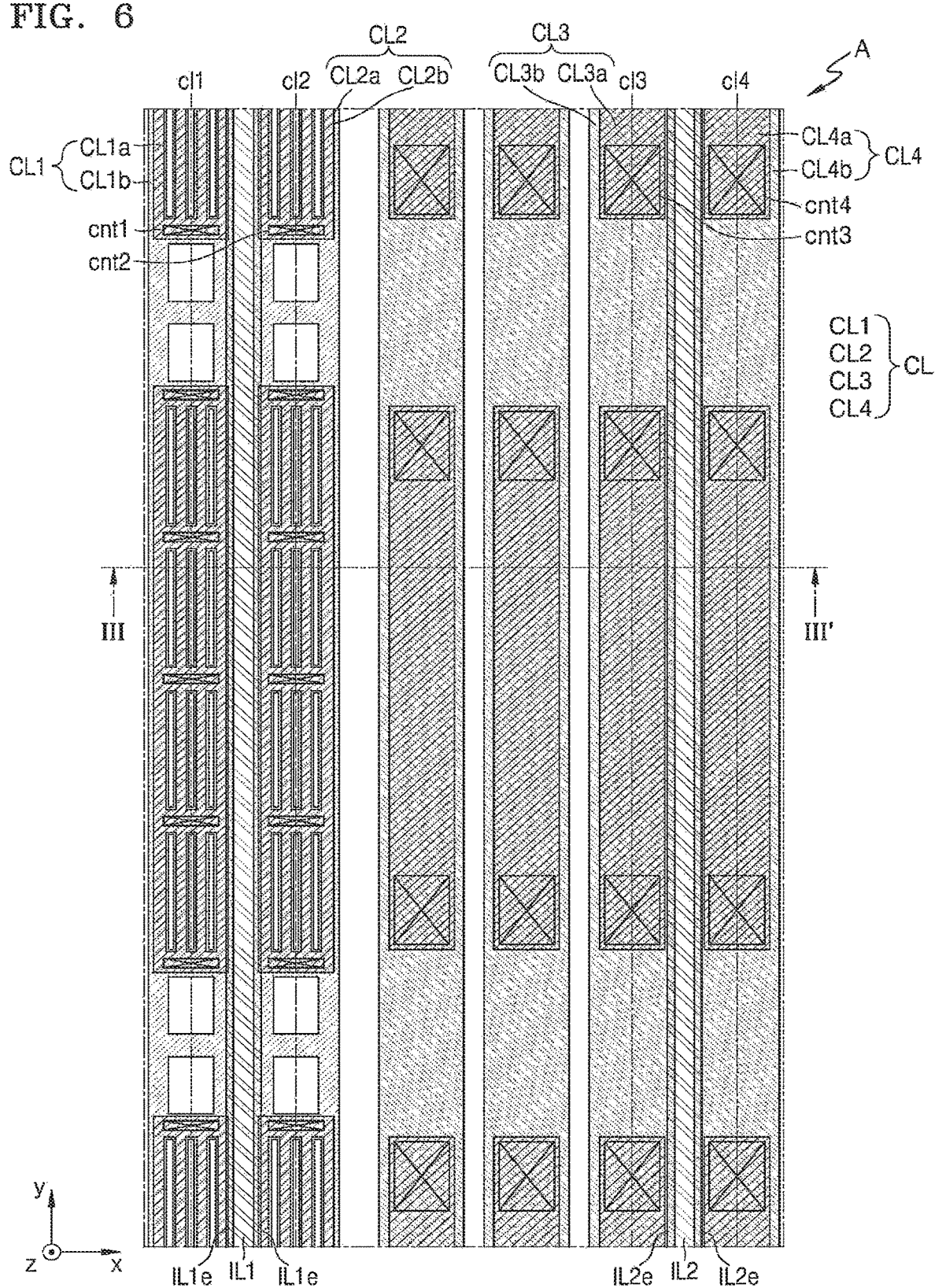
FIG. 6 is a schematic enlarged view of a portion of a display apparatus, according to some embodiments.

FIG. 6 is a schematic enlarged view of a portion of a display apparatus, according to some embodiments. FIG. 6 illustrates aspects of some embodiments that are modified compared to the embodiments described with respect to FIG. 4 and the embodiments illustrated in FIG. 6 are different from the embodiments illustrated with respect to FIG. 4 in terms of the structure of insulating lines. The descriptions that are the same as those of FIG. 4 may not be repeated, and differences between FIGS. 4 and 6 are mainly described.

Referring to FIG. 6, the first insulating line IL1 may at least partially overlap the first conductive line CL1 and the second conductive line CL2. The second insulating line IL2 may at least partially overlap the third conductive line CL3 and the fourth conductive line CL4.

For example, the first edge IL1e on one side of the first insulating line IL1 extending in the second direction (e.g., the ±y direction) may overlap the first conductive line CL1, and the first edge IL1e on the other side of the first insulating line IL1 extending in the second direction (e.g., the ±y direction) may overlap the second conductive line CL2. The second edge IL2e on one side of the second insulating line IL2 extending in the second direction (e.g., the ±y direction) may overlap the third conductive line CL3, and the second edge IL2e on the other side of the second insulating line IL2 extending in the second direction (e.g., the ±y direction) may overlap the fourth conductive line CL4.

Figure 7:
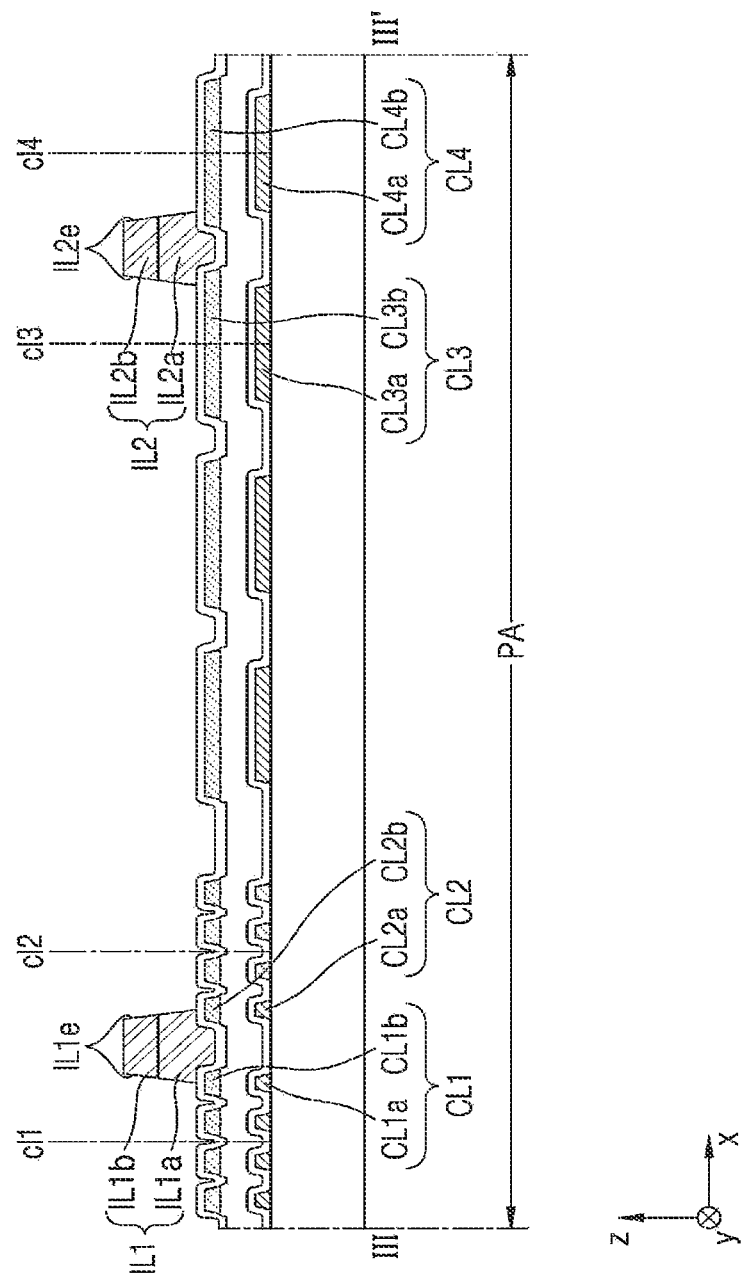
FIG. 7 is a cross-sectional view of conductive lines and insulating lines of FIG. 6, taken along the line III-III'.

FIG. 7 is a cross-sectional view of the conductive lines and the insulating lines of FIG. 6, taken along line 111-111'. FIG. 7 is a modified example of FIG. 5 and is different therefrom in terms of the structure of the insulating lines. Hereinafter, the descriptions that are the same as those provided above are not repeated, and a difference between FIGS. 5 and 7 is mainly described.

Referring to FIG. 7, the first insulating line IL1 may be arranged between the first conductive line CL1 and the second conductive line CL2, and the second insulating line IL2 may be arranged between the third conductive line CL3 and the fourth conductive line CL4. The first edges IL1e on both sides of the first insulating line IL1 may be between the first center line cl1 of the first conductive line CL1 and the second center line cl2 of the second conductive line CL2, and the second edges IL2e on both sides of the second insulating line IL2 may be between the third center line cl3 of the third conductive line CL3 and the fourth center line cl4 of the fourth conductive line CL4.

The first insulating line IL1 may at least partially overlap the first conductive line CL1 and the second conductive line CL2. The second insulating line IL2 may at least partially overlap the third conductive line CL3 and the fourth conductive line CL4. For example, the first edges IL1e on both sides of the first insulating line IL1 may overlap the first conductive line CL1 and the second conductive line CL2, respectively. The second edges IL2e on both sides of the second insulating line IL2 may overlap the third conductive line CL3 and the fourth conductive line CL4.

Figure 8:
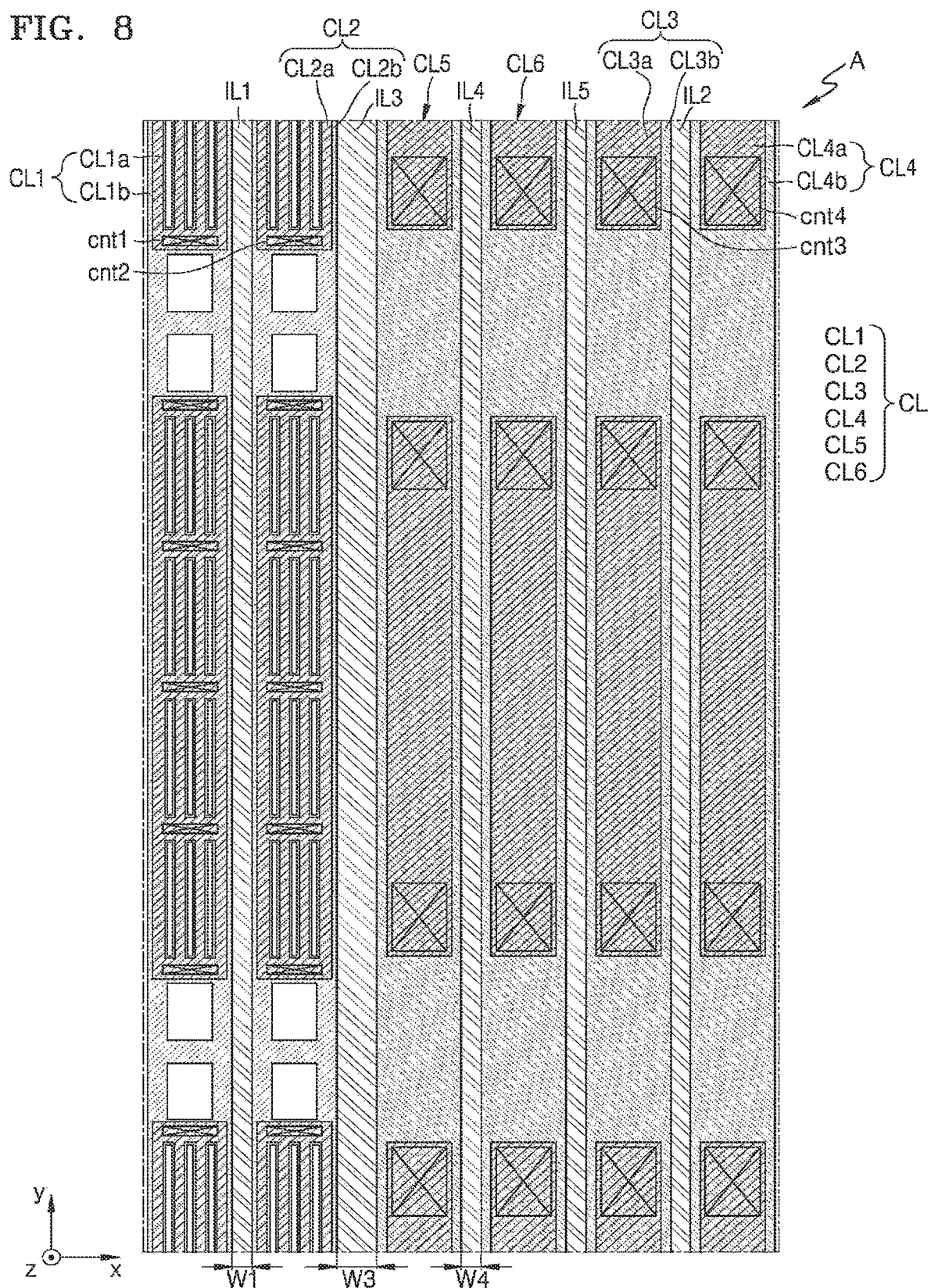
FIG. 8 is a schematic enlarged view of a portion of a display apparatus, according to some embodiments.

FIG. 8 is a schematic enlarged view of a portion of a display apparatus, according to some embodiments. FIG. 8 is a modified example of FIG. 4 and is different therefrom in terms of the structure of the insulating lines. Hereinafter, the descriptions that are the same as those provided above are not repeated, and a difference between FIGS. 4 and 8 is mainly described.

Referring to FIG. 8, at least one insulating line extending in the second direction (e.g., the ±y direction) may be arranged between the conductive lines CL arranged between the second conductive line CL2 and the third conductive line CL3. For example, a fifth conductive line CL5 and a sixth conductive line CL6 may be arranged between the second conductive line CL2 and the third conductive line CL3. A third insulating line IL3 may be arranged between the second conductive line CL2 and the fifth conductive line CL5, a fourth insulating line IL4 may be arranged between the fifth conductive line CL5 and the sixth conductive line CL6, and a fifth insulating line IL5 may be arranged between the sixth conductive line CL6 and the third conductive line CL3. The first insulating line IL1 to the fifth insulating line IL5 may function as mask supports.

According to some embodiments, a width W3 of the third insulating line IL3 in the first direction (e.g., the ±x direction) may be greater than a width W1 of the first insulating line IL1 in the first direction (e.g., the ±x direction). The embodiments are described based on the first insulating line IL1, but the same description may be applied to the second insulating line IL2.

According to some embodiments, a width W4 of the fourth insulating line IL4 in the first direction (e.g., the ±x direction) may be substantially the same as the width W1 of the first insulating line IL1 in the first direction (e.g., the ±x direction). The description is provided based on the first insulating line IL1 and the fourth insulating line IL4, but the same description may be applied to the second insulating line IL2 and the fifth insulating line IL5.

According to some embodiments, a length of the third insulating line IL3 in the second direction (e.g., the ±y direction) may be substantially the same as a length of the first insulating line IL1 in the second direction (e.g., the ±y direction). The description is provided based on the first insulating line IL1 and the third insulating line IL3, but the same description may be applied to the second insulating line IL2, the fourth insulating line IL4, and the fifth insulating line IL5.

Figure 9:
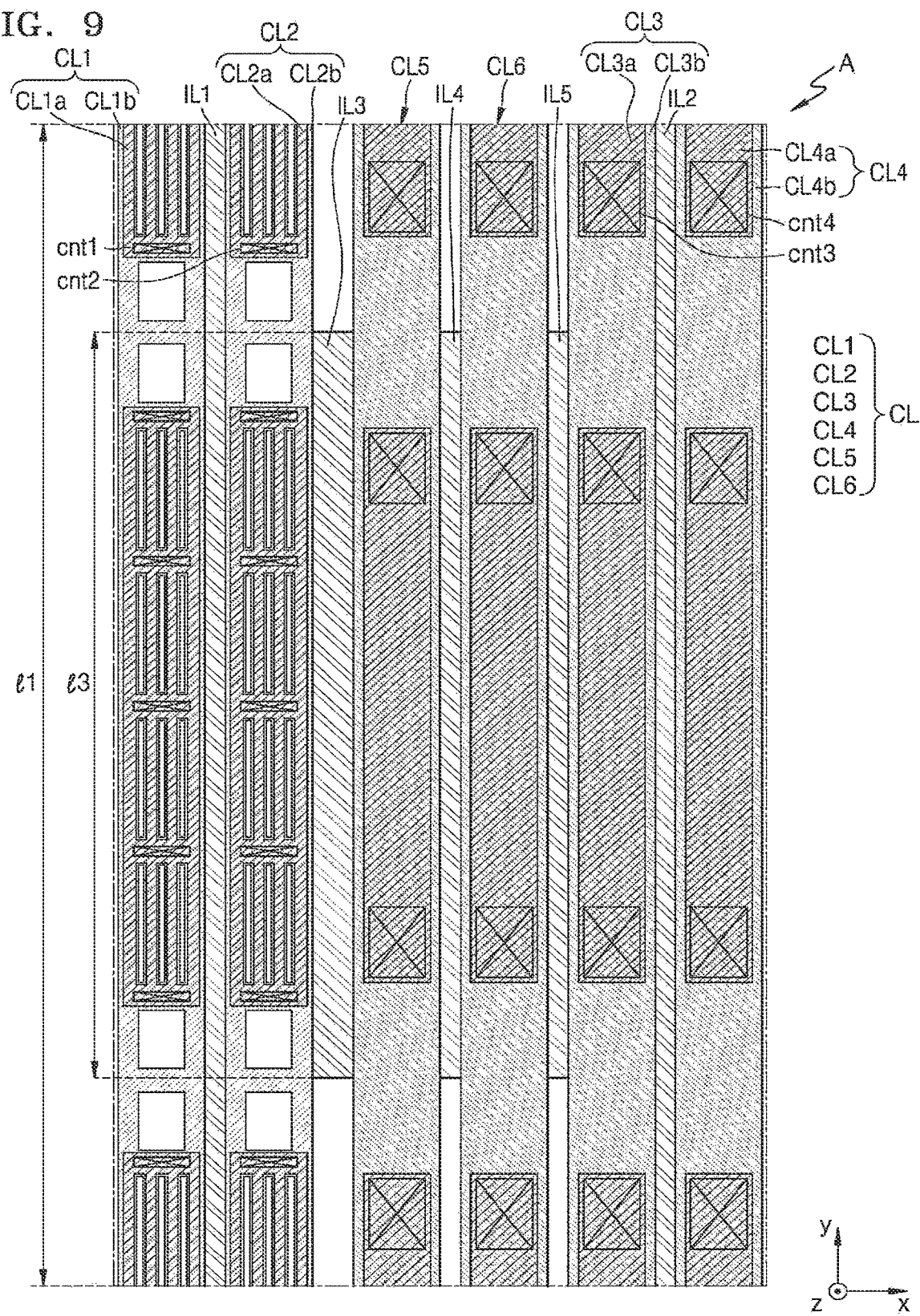
FIG. 9 is a schematic enlarged view of a portion of a display apparatus, according to some embodiments.

FIG. 9 is a schematic enlarged view of a portion of a display apparatus, according to some embodiments. FIG. 9 is a modified example of FIG. 8 and is different therefrom in terms of the structure of the insulating lines. Hereinafter, the descriptions that are the same as those provided above are not repeated, and a difference between FIGS. 8 and 9 is mainly described.

Referring to FIG. 9, a length n of the third insulating line IL3 in the second direction (e.g., the ±y direction) may be less than a length l1 of the first insulating line IL1 in the second direction (e.g., the ±y direction). The description is provided based on the first insulating line IL1 and the third insulating line IL3, but the same description may be applied to the second insulating line IL2, the fourth insulating line IL4, and the fifth insulating line IL5.

Figure 10:
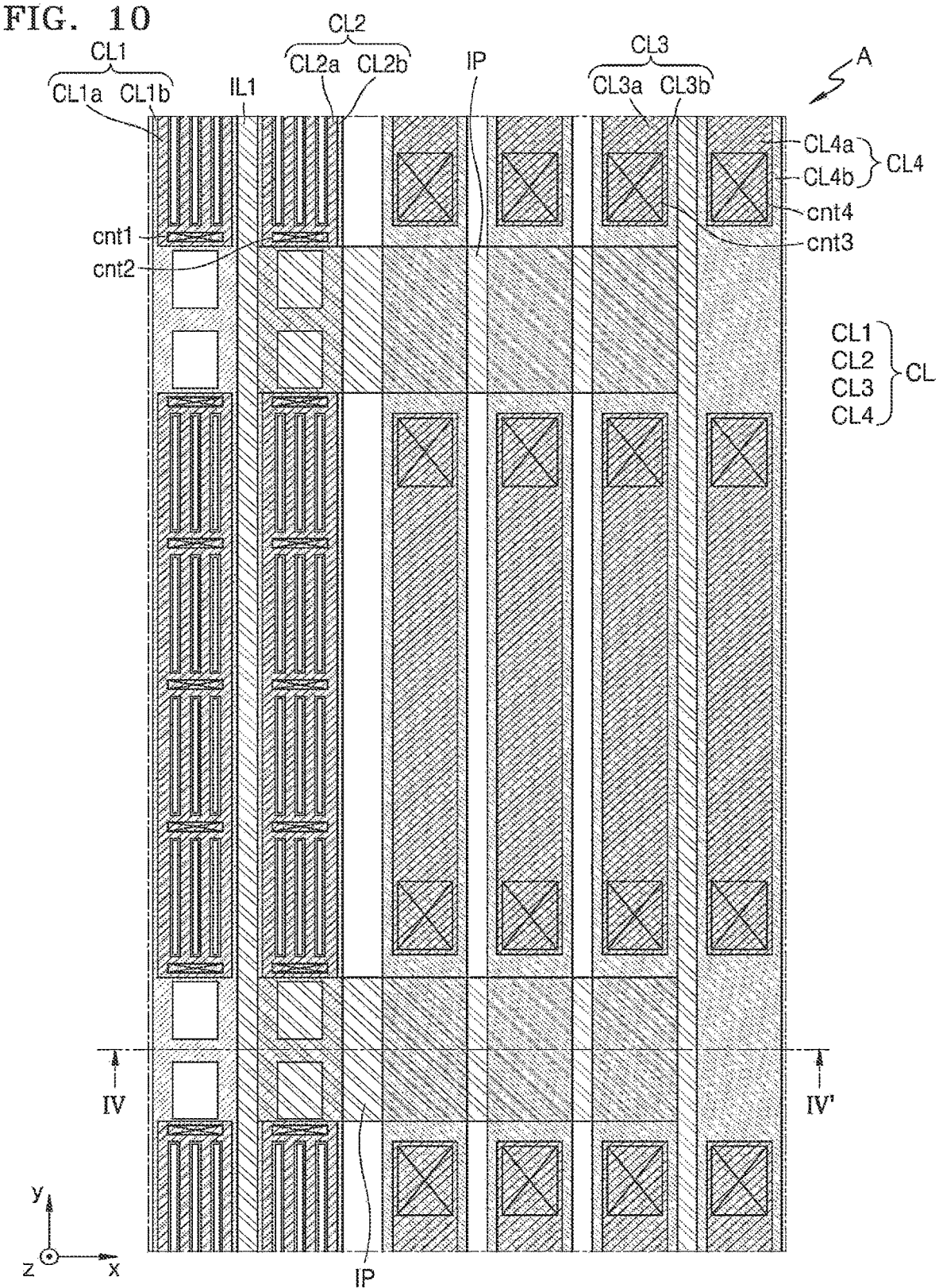
FIG. 10 is a schematic enlarged view of a portion of a display apparatus, according to some embodiments.

FIG. 10 is a schematic enlarged view of a portion of a display apparatus, according to some embodiments. FIG. 10 is a modified example of FIG. 4 and is different therefrom in terms of the structure of the insulating lines. Hereinafter, the descriptions that are the same as those provided above are not repeated, and a difference between FIGS. 4 and 10 is mainly described.

Referring to FIG. 10, the display apparatus 1 (see FIG. 1) may include an insulating pattern IP configured to connect the first insulating line IL1 to the second insulating line IL2. The insulating pattern IP may overlap at least some portions of the second conductive line CL2 and third conductive line CL3. The first insulating line IL1, the second insulating line IL2, and the insulating pattern IP may function as mask supports.

The insulating pattern IP may be provided in plural, and the insulating patterns IP may be arranged apart from each other in the second direction (e.g., the ±y direction). The lower conductive lines of the conductive lines CL may be arranged between insulating patterns IP that are neighboring (or adjacent) to each other in the second direction (e.g., the ±y direction) from among the insulating patterns IP. The insulating patterns IP and the lower conductive lines of each of the conductive lines CL may be alternately arranged in the second direction (e.g., the ±y direction). For example, the second lower conductive line CL2a of the second conductive line CL2 and the third lower conductive line CL3a of the third conductive line CL3 may be arranged between the insulating patterns IP that are adjacent to each other. The insulating patterns IP, the second lower conductive lines CL2a of the second conductive line CL2, and the third lower conductive lines CL3a of the third conductive line CL3 may be alternately arranged in the second direction (e.g., the ±y direction).

Figure 11:
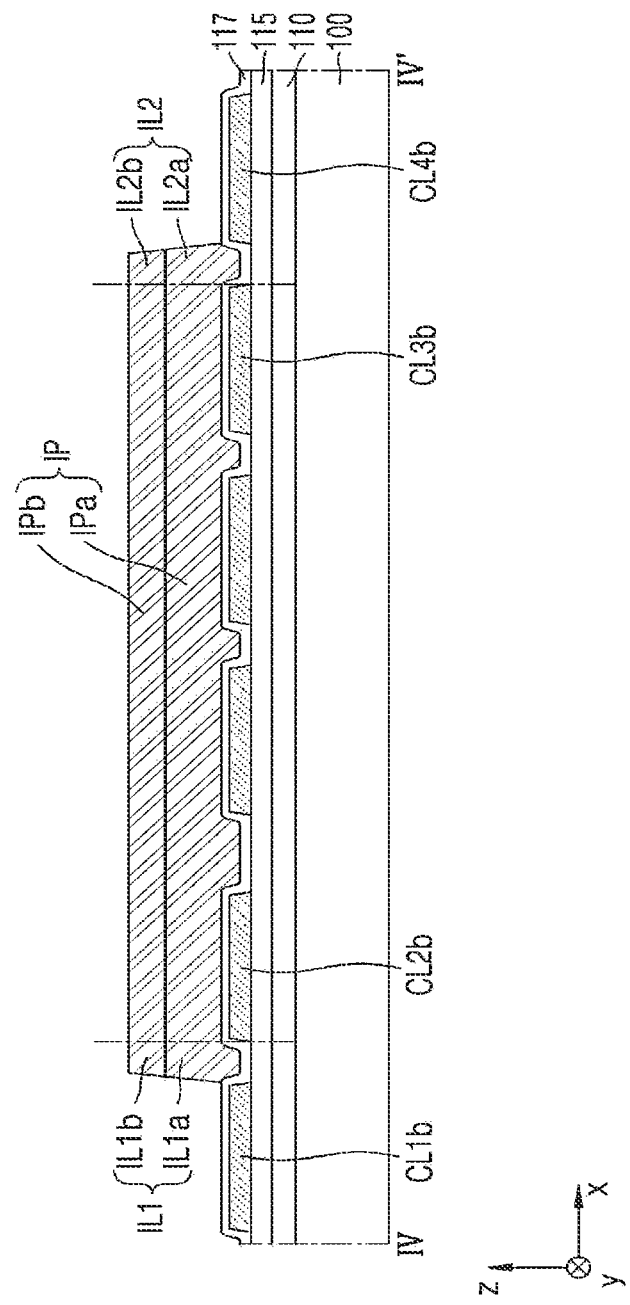
FIG. 11 is an example cross-sectional view of a conductive line, an insulating line, and an insulating pattern of FIG. 10, taken along the line IV-IV'.

FIG. 11 is an example cross-sectional view of the conductive line, the insulating line, and the insulating pattern of FIG. 10, taken along line IV-IV'. Like reference numerals in FIGS. 5 and 11 denote like elements, and the repeated descriptions thereof are omitted.

Referring to FIG. 11, the insulating pattern IP may be configured to connect the first insulating line IL1 to the second insulating line IL2. For example, the insulating pattern IP may include a first lower insulating pattern IPa configured to connect the first lower insulating line IL1a to the second lower insulating line IL2a and a second lower insulating pattern IPb configured to connect the first upper insulating line IL1b to the second upper insulating line IL2b.

The insulating pattern IP may overlap at least some portions of the second conductive line CL2 and the third conductive line CL3. The insulating pattern IP may overlap at least some portions of conductive lines arranged between the second conductive line CL2 and the third conductive line CL3.

Figure 12:
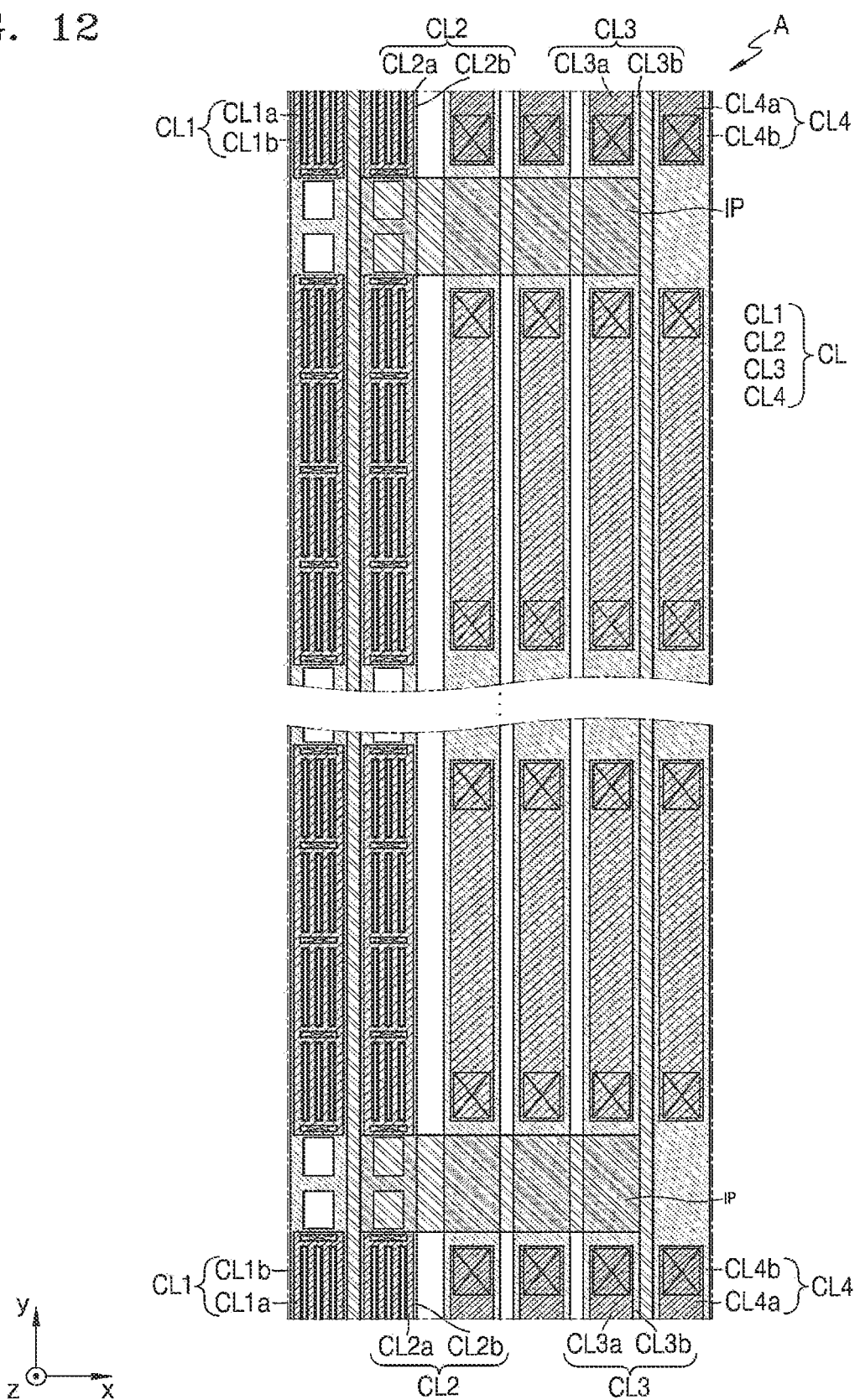
FIG. 12 is a schematic enlarged view of a portion of a display apparatus, according to some embodiments.

FIG. 12 is a schematic enlarged view of a portion of a display apparatus, according to some embodiments. FIG. 12 is a modified example of FIG. 10 and is different therefrom in terms of the structure of the insulating lines. Hereinafter, the descriptions that are the same as those provided above are not repeated, and a difference between FIGS. 10 and 12 is mainly described.

Referring to FIG. 12, the insulating pattern IP may be provided in plural, and the insulating patterns IP may be arranged apart from each other in the second direction (e.g., the ±y direction). The number of lower conductive lines of each of the conductive lines CL arranged between the insulating patterns IP, which are neighboring (or adjacent to each other in the second direction (e.g., the ±y direction) from among the insulating patterns IP, may be n. The number of second lower conductive lines CL2a of the second conductive line CL2, which are arranged between the insulating patterns IP that are adjacent to each other, may be n. The number of third lower conductive lines CL3a of the third conductive line CL3, which are arranged between the insulating patterns IP that are adjacent to each other, may be n. In other words, n second lower conductive lines CL2a and n third lower conductive lines CL3a may be arranged between the neighboring insulating patterns IP. Here, n is a natural number equal to or greater than 2.

For example, five second lower conductive lines CL2a and five third lower conductive lines CL3a may be arranged between the neighboring insulating patterns IP. Alternatively, ten second lower conductive lines CL2a and ten third lower conductive lines CL3a may be arranged between the neighboring insulating patterns IP.

Distances between the insulating patterns IP, which are adjacent to each other, have been described based on the lower conductive lines of each conductive line so far, but may be described based on the stage ST (see FIG. 1) of the gate driver 200 (see FIG. 1). For example, n stages ST may be arranged between neighboring insulating patterns IP.

Figure 13:
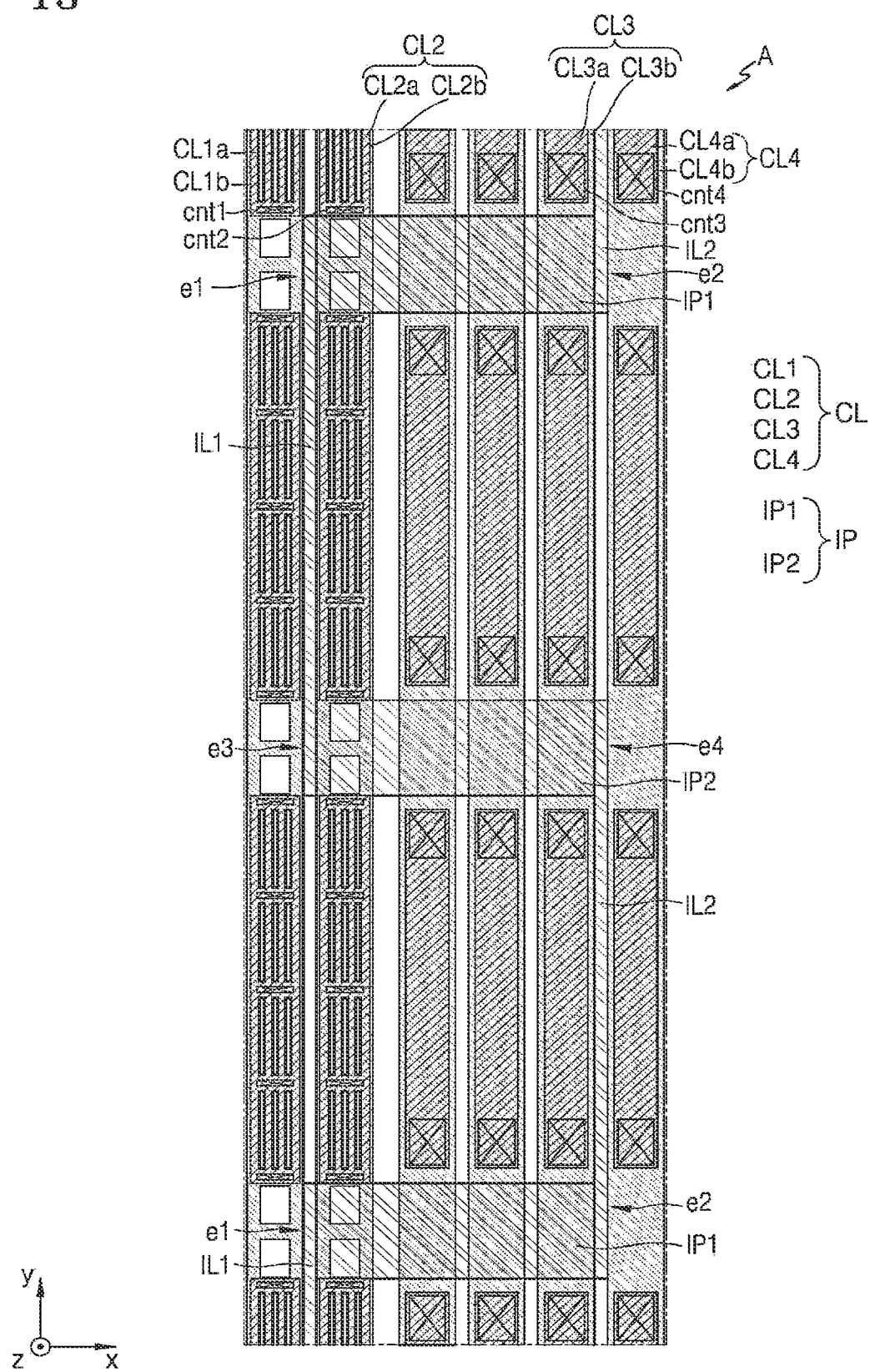
FIG. 13 is a schematic enlarged view of a portion of a display apparatus, according to some embodiments.

FIG. 13 is a schematic enlarged view of a portion of a display apparatus, according to some embodiments. FIG. 13 is a modified example of FIG. 10 and is different therefrom in terms of the structures of the insulating lines and insulating patterns. Hereinafter, the descriptions that are the same as those provided above are not repeated, and a difference between FIGS. 10 and 13 is mainly described.

Referring to FIG. 13, the first insulating line IL1 and the second insulating line IL2 may each be provided in plural. The first insulating lines IL1 may be arranged apart from each other in the second direction (e.g., the ±y direction), and the second insulating lines IL2 may be arranged apart from each other in the second direction (e.g., the ±y direction). The first insulating lines IL1 and the second insulating lines IL2 may be alternately arranged in the second direction (e.g., the ±y direction).

The insulating patterns IP may include a plurality of first insulating patterns IP1 and a plurality of second insulating patterns IP2. The first insulating patterns IP1 and the second insulating patterns IP2 may be alternately arranged in the second direction (e.g., the ±y direction). Each of the first insulating patterns IP1 may connect a first end e1 of each first insulating line IL1 to a second end e2 of each second insulating line IL2. Each of the second insulating patterns IP2 may connect a third end e3 of each first insulating line IL1 to a fourth end e4 of each second insulating line IL2.

The first end e1 of each first insulating line IL1 may face the third end e3 thereof, and the second end e2 of each second insulating line IL2 may face the fourth end e4 thereof.

Figure 14:
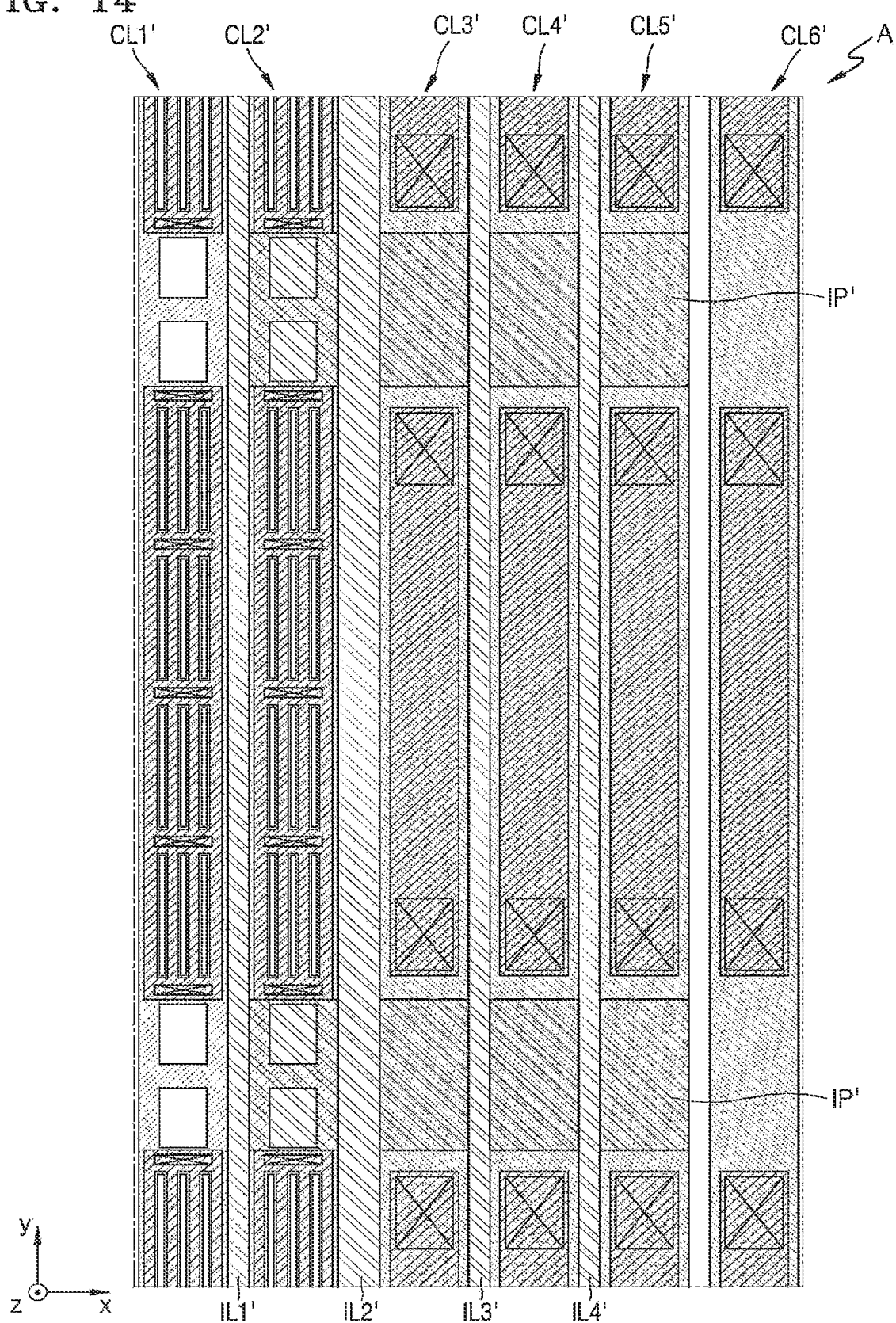
FIG. 14 is a schematic enlarged view of a portion of a display apparatus, according to some embodiments.

FIG. 14 is a schematic enlarged view of a portion of a display apparatus, according to some embodiments.

Referring to FIG. 14, a first conductive line CL1' to a sixth conductive line CL6' may be arranged on one side of the peripheral area PA (see FIG. 1) in the first direction (e.g., the ±x direction). The first conductive line CL1' to the sixth conductive line CL6' may extend in the second direction (e.g., the ±y direction). The first conductive line CL1' to the sixth conductive line CL6' may correspond to the clock signal lines of FIG. 3 described above. For example, the first conductive line CL1' and the second conductive line CL2' may correspond to the scan clock signal lines SC of FIG. 3, and the third conductive line CL3' to the sixth conductive line CL6' may correspond to the sensing clock signal lines SS of FIG. 3.

Each of the first conductive line CL1' to the sixth conductive line CL6' may include a lower conductive line and an upper conductive line electrically connected to the lower conductive line. The lower conductive line may overlap the upper conductive line.

A first insulating line IL1' to a fourth insulating line IL4' may be arranged on one side of the peripheral area PA in the first direction (e.g., the ±x direction). The first insulating line IL1' to the fourth insulating line IL4' may extend in the second direction (e.g., the ±y direction). The first insulating line IL1' may be arranged between the first conductive line CL1' and the second conductive line CL2', and the second insulating line IL2' may be arranged between the second conductive line CL2' and the third conductive line CL3', the third insulating line IL3' may be arranged between the third conductive line CL3' and the fourth conductive line CL4', and the fourth insulating line IL4' may be arranged between the fourth conductive line CL4' and the fifth conductive line CL5'.

Insulating patterns IP' may be arranged apart from each other on one side of the peripheral area PA in the second direction (e.g., the ±y direction). The insulating patterns IP' may be configured to connect the first insulating line IL1' to the fourth insulating line IL4' to each other. The insulating patterns IP' may overlap at least some portions of the second conductive line CL2' to the sixth conductive line CL6'.

FIG. 14 shows that the number of lower conductive lines of the second conductive line CL2' arranged between the neighboring insulating patterns IP' is 1, but according to some embodiments, as described above with reference to FIG. 12, the number of lower conductive lines of the second conductive line CL2' arranged between the neighboring insulating patterns IP' may be equal to or greater than 2. The description is provided based on the second conductive line CL2', but the same description may be applied to other conductive lines.

Figure 15:
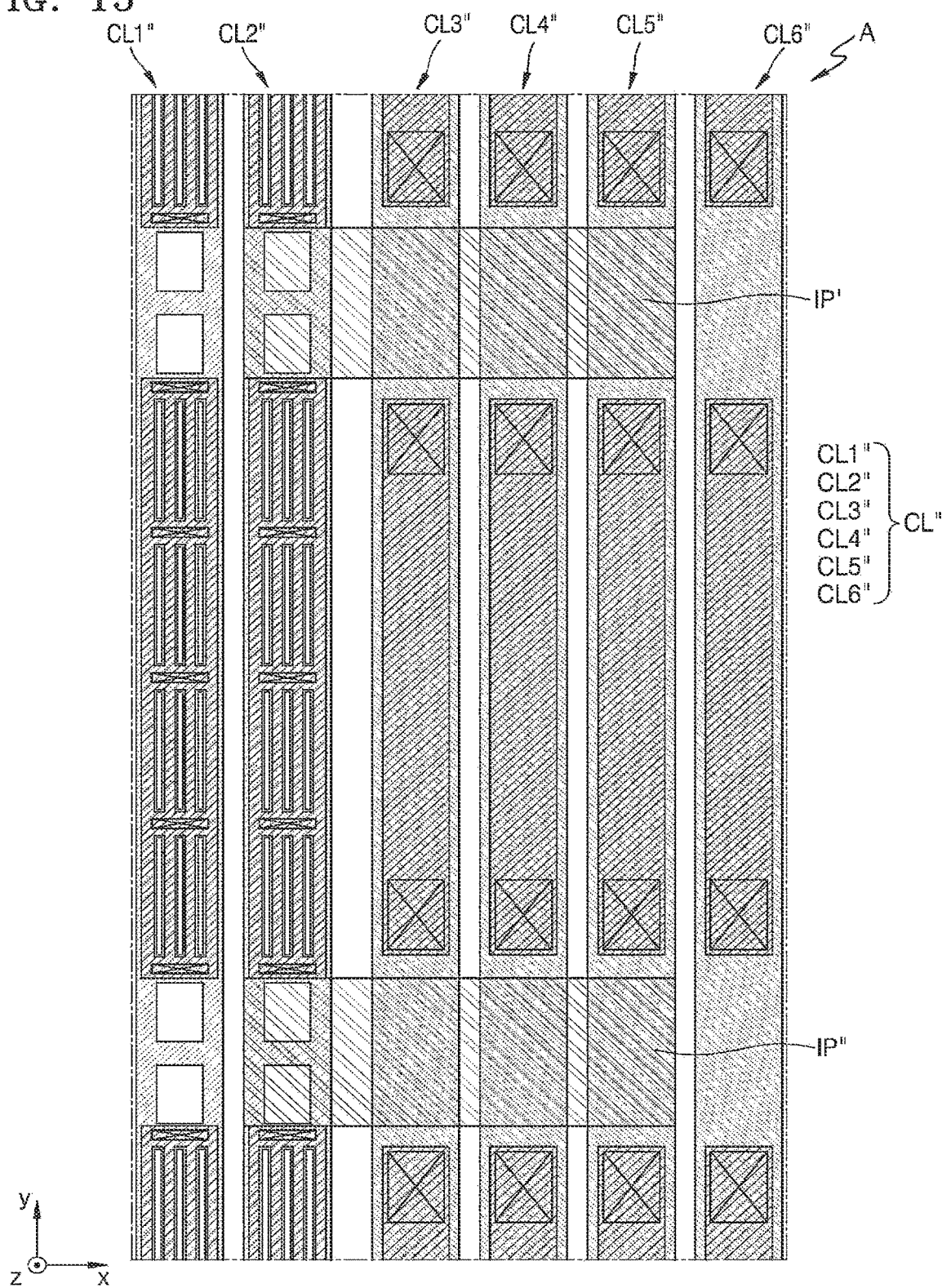
FIG. 15 is a schematic enlarged view of a portion of a display apparatus, according to some embodiments.

FIG. 15 is a schematic enlarged view of a portion of a display apparatus, according to some embodiments.

Referring to FIG. 15, a first conductive line CL1" to a sixth conductive line CL6" may be arranged on one side of the peripheral area PA (see FIG. 1) in the first direction (e.g., the ±x direction). The first conductive line CL1" to the sixth conductive line CL6" may extend in the second direction (e.g., the ±y direction). The first conductive line CL1" to the sixth conductive line CL6" may correspond to the clock signal lines of FIG. 3 described above. For example, the first conductive line CL1" and the second conductive line CL2" may correspond to the scan clock signal lines SC of FIG. 3, and the third conductive line CL3" to the sixth conductive line CL6" may correspond to the sensing clock signal lines SS of FIG. 3.

Each of the first conductive line CL1" to the sixth conductive line CL6" may include a lower conductive line and an upper conductive line electrically connected to the lower conductive line. The lower conductive line may overlap the upper conductive line.

Insulating patterns IP"', lengthwise directions of which are the first direction (e.g., the ±x direction), may be arranged apart from each other on one side of the peripheral area PA in the second direction (e.g., the ±y direction). The insulating patterns IP"' may overlap at least some portions of some conductive lines CL". For example, the insulating patterns IP"' may overlap at least some portions of the second conductive line CL2" to the fifth conductive line CL5". The insulating patterns IP"' may function as mask supports.

FIG. 15 shows that the number of lower conductive lines of the second conductive line CL2" arranged between the neighboring insulating patterns IP"' is 1, but according to some embodiments, as described above with reference to FIG. 12, the number of lower conductive lines of the second conductive line CL2" arranged between the neighboring insulating patterns IP"' may be equal to or greater than 2. The description is provided based on the second conductive line CL2", but the same description may be applied to other conductive lines.

FIGS. 16 to 18 are schematic cross-sectional views of a method of manufacturing a display apparatus, according to some embodiments. Like reference numerals in FIGS. 16 to 18 denote like elements, and repeated descriptions thereof are omitted.

First of all, referring to FIG. 16, the substrate 100, the first insulating line IL1, the second insulating line IL2, and the pixel-defining layer 121 are sequentially formed, and then, the emission layer 420 may be formed. The emission layer 420 may be formed to cover the display area DA by using the first mask MASK1. The first mask MASK1 may be an open mask.

In this case, the first insulating line IL1 and the second insulating line IL2 may function as supports for supporting the first mask MASK1. The first mask MASK1 may have a first protrusion M1g, and the first insulating line IL1 and the second insulating line IL2 may directly contact the first protrusion M1g of the first mask MASK1.

Referring to FIG. 17, the emission layer 420 may be formed, and then the opposite electrode 430 may be formed. The opposite electrode 430 may be formed to cover the display area DA by using the second mask MASK2. The second mask MASK2 may be an open mask.

In this case, the first insulating line IL1 and the second insulating line IL2 may function as supports for supporting the second mask MASK2. The second mask MASK2 may have a second protrusion M2g, and the first insulating line IL1 and the second insulating line IL2 may directly contact the second protrusion M2g of the second mask MASK2.

Referring to FIG. 18, the opposite electrode 430 may be formed, and then the encapsulation layer 500 may be formed. The encapsulation layer 500 may be formed to cover the display area DA by using the third mask MASK3. The third mask MASK3 may be an open mask.

In this case, the first insulating line IL1 and the second insulating line IL2 may function as supports for supporting the third mask MASK3. The third mask MASK3 may have a third protrusion M3g, and the first insulating line IL1 and the second insulating line IL2 may directly contact the third protrusion M3g of the third mask MASK3.

Figure 19:
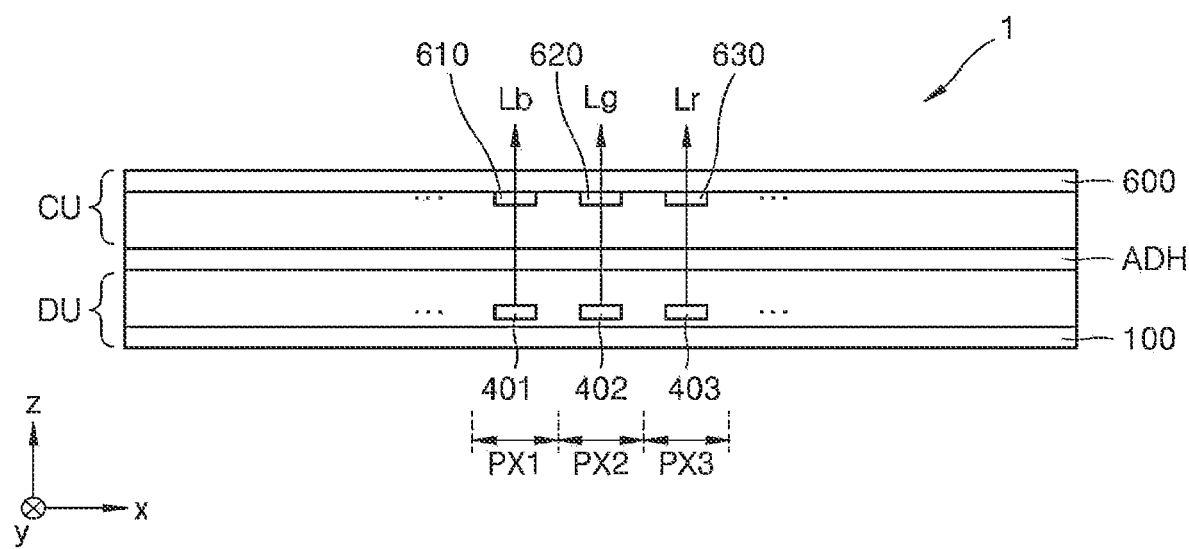
FIG. 19 is a schematic cross-sectional view of a display apparatus according to some embodiments.

FIG. 19 is a schematic cross-sectional view of a display apparatus according to some embodiments.

Referring to FIG. 19, the display apparatus 1 may include a display unit DU and a color filter unit CU facing the display unit DU. The display unit DU may include a first pixel PX1, a second pixel PX2, and a third pixel PX3 arranged on the substrate 100. The first pixel PX1, the second pixel PX2, and the third pixel PX3 may be pixels emitting different colors on the substrate 100. For example, the first pixel PX1 may emit blue light Lb, the second pixel PX2 may emit green light Lg, and the third pixel PX3 may emit red light Lr.

The first pixel PX1, the second pixel PX2, and the third pixel PX3 may respectively include a first light-emitting diode 401, a second light-emitting diode 402, and a third light-emitting diode 403 that include organic light-emitting diodes OLED. According to some embodiments, the first light-emitting diode 401, the second light-emitting diode 402, and the third light-emitting diode 403 may emit blue light Lb. According to some embodiments, the first light-emitting diode 401, the second light-emitting diode 402, and the third light-emitting diode 403 may emit the blue light Lb, the green light Lg, and the red light Lr, respectively.

The color filter unit CU may include a first filter unit 610, a second filter unit 620, and a third filter unit 630. Light emitted from the first light-emitting diode 401, the second light-emitting diode 402, and the third light-emitting diode 403 may pass through the first filter unit 610, the second filter unit 620, and the third filter unit 630 and thus may be emitted as the blue light Lb, the green light Lg, and the red light Lr.

The first filter unit 610, the second filter unit 620, and the third filter unit 630 may be arranged right above an upper substrate 600. The first filter unit 610 may include a penetration layer 619 and a first-color color filter layer 611 of FIG. 21 described below, the second filter unit 620 may include a second-color quantum dot layer 629 and a second-color color filter layer 621 of FIG. 21 described below, and the third filter unit 630 may include a third-color quantum dot layer 639 and a third-color color filter layer 631 of FIG. 21 described below.

In this case, the description that the components are right above the upper substrate 600 may indicate that the first filter unit 610, the second filter unit 620, and the third filter unit 630 are directly formed on the upper substrate 600 to form the color filter unit CU. Then, the first filter unit 610, the second filter unit 620, and the third filter unit 630 may respectively face the first pixel PX1, the second pixel PX2, and the third pixel PX3 to thereby allow the display unit DU to be connected (or adhere) to the color filter unit CU. In this case, the number of substrates included in the display apparatus 1 may be 2.

FIG. 19 shows that the display unit DU is connected to the color filter unit CU by an adhesion layer ADH. The adhesion layer ADH may be, for example, an Optical Clear Adhesive (OCA), but one or more embodiments are not limited thereto. The adhesion layer ADH may be omitted. According to some embodiments, the adhesion layer ADH may be a filler material 700 (see FIG. 21) and buffer external pressure, etc. The filler material 700 may include an organic material such as methyl silicone, phenyl silicone, or polyimide.

FIG. 19 shows that the first filter unit 610, the second filter unit 620, and the third filter unit 630 are arranged on the upper substrate 600, but according to some embodiments, the first filter unit 610, the second filter unit 620, and the third filter unit 630 may be arranged on the display unit DU. For example, an encapsulation layer may be arranged on the first light-emitting diode 401, the second light-emitting diode 402, and the third light-emitting diode 403, and the first filter unit 610, the second filter unit 620, and the third filter unit 630 may be arranged on the encapsulation layer. The penetration layer 619, the second-color quantum dot layer 629, the third-color quantum dot layer 639, the first-color color filter layer 611, the second-color color filter layer 621, and the third-color color filter layer 631 may be arranged on the encapsulation layer. First of all, the penetration layer 619, the second-color quantum dot layer 629, and the third-color quantum dot layer 639 may be respectively arranged on the encapsulation layer, and then, the first-color color filter layer 611, the second-color color filter layer 621, and the third-color color filter layer 631 may be respectively arranged. In this case, the upper substrate 600 may be omitted, and the number of substrates included in the display apparatus 1 may be 1.

Figure 20:
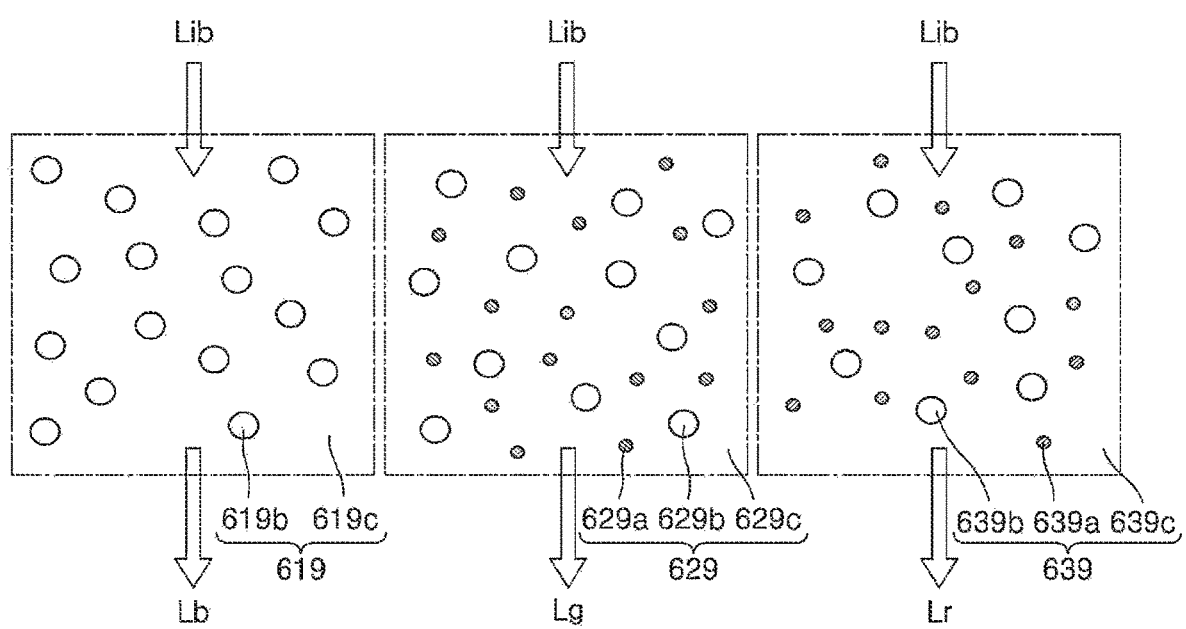
FIG. 20 is a schematic enlarged view of a portion of a display apparatus, according to some embodiments.

FIG. 20 is a schematic enlarged view of a portion of a display apparatus, according to some embodiments. Referring to FIG. 20, the penetration layer 619, the second-color quantum dot layer 629, and the third-color quantum dot layer 639 are enlarged.

Referring to FIG. 20, the penetration layer 619 may penetrate blue incident light Lib so that the blue light Lb may be emitted towards the upper substrate 600 (see FIG. 19). The penetration layer 619 may include a first photosensitive polymer 619c on which first scattered particles 619b are spread.

The first photosensitive polymer 619c may include an organic material, for example, silicon resin, epoxy resin, or the like, which is light-transmissive. The first scattered particles 619b may scatter and emit the blue incident light Lib and include $TiO_2$, metal particles, or the like.

The second-color quantum dot layer 629 may convert the blue incident light Lib into the green light Lg. The second-color quantum dot layer 629 may include first quantum dots 629a and a second photosensitive polymer 629c on which second scattered particles 629b are spread.

The first quantum dots 629a may be excited by the blue incident light Lib and isotropically emit the green light Lg having a greater wavelength than blue light. The second photosensitive polymer 629c may include a light-transmissive organic material and be the same material as first photosensitive polymer 619c. The second scattered particles 629b may increase a color conversion rate of the second-color quantum dot layer 629 by scattering the blue incident light Lib, which has not yet been absorbed into the first quantum dots 629a, to make more first quantum dots 629a be excited. The second scattered particles 629b may include the same material as the first scattered particles 619b.

The third-color quantum dot layer 639 may convert the blue incident light Lib into the red light Lr. The third-color quantum dot layer 639 may include second quantum dots 639a and a third photosensitive polymer 639c on which and third scattered particles 639b are spread.

The second quantum dots 639a may be excited by the blue incident light Lib and isotropically emit the red light Lr having a greater wavelength than blue light. The third photosensitive polymer 639c may be a light-transmissive organic material and be the same material as the first photosensitive polymer 619c. The third scattered particles 639b may increase a color conversion rate of the third-color quantum dot layer 639 by scattering the blue incident light Lib, which has not yet been absorbed into the second quantum dots 639a, to make more second quantum dots 639a be excited. The third scattered particles 639b may be the same material as the first scattered particles 619b.

As described above, the second-color quantum dot layer 629 and the third-color quantum dot layer 639 may each include quantum-dot materials. The core of the quantum dot may be selected from among II-VI group compounds, III-V group compounds, IV-VI group compounds, IV group elements, IV group compounds, and a combination thereof.

The II-VI group compounds may be selected from the group consisting of: a binary compound selected from the group consisting of CdSe, CdTe, ZnS, ZnSe, ZnTe, ZnO, HgS, HgSe, HgTe, MgSe, MgS, and a mixture thereof; a three-element compound selected from the group consisting of AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The group III-V compound may be selected from the group consisting of: a binary compound selected from the group consisting of GaN, GaP, GaAs, GaSb, AlN, AlP, AlAs, AlSb, InN, InP, InAs, InSb, and a mixture thereof; a three-element compound selected from the group consisting of GaNP, GaNAs, GaNSb, GaPAs, GaPSb, AlNP, AlNAs, AlNSb, AlPAs, AlPSb, InGaP, InNP, InNAs, InNSb, InPAs, InPSb, GaAlNP, and a mixture thereof; and a quaternary compound selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof.

The group IV-VI compound may be selected from the group consisting of: a binary compound selected from the group consisting of SnS, SnSe, SnTe, PbS, PbSe, PbTe, and a mixture thereof; a three-element compound selected from the group consisting of SnSeS, SnSeTe, SnSTe, PbSeS, PbSeTe, PbSTe, SnPbS, SnPbSe, SnPbTe, and a mixture thereof; and a quaternary compound selected from the group consisting of SnPbSSe, SnPbSeTe, SnPbSTe, and a mixture thereof. The group IV element may be selected from the group consisting of Si, Ge, and a mixture thereof. The group IV compound may be a binary compound selected from the group consisting of SiC, SiGe, and a mixture thereof.

In this case, the binary compound, the three-element compound, and the quaternary compound may exist in particles in uniform concentrations or in the same particle in partially different concentrations. Also, a quantum dot may have a core-shell structure in which one quantum dot surrounds another quantum dot. An interface of the core and the shell may have a concentration gradient in which a concentration of elements existing in the shell decreases to the center.

In some embodiments, the quantum dot may have a core-shell structure that includes the core including the above-described nano-crystals and the shell surrounding the core. The shell of the quantum dot may function as a protection layer for maintaining semiconductor characteristics by preventing or reducing a chemical modification of the core and/or a charging layer for providing electrophoresis characteristics to the quantum dot. The shell may be a layer or layers. An interface of the core and the shell may have a concentration gradient in which a concentration of elements existing in the shell decreases to the center. Examples of the shell of the quantum dot may include metal oxide, non-metal oxide, a semiconductor compound, or a combination thereof.

For example, examples of metal or non-metal oxide may include a binary compound including $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, or the like, or a three-element compound including $MgAl_2O_4$, $CoFe_2O_4$, $NiFe_2O_4$, $CoMn_2O_4$, or the like, but one or more embodiments are not limited thereto.

Also, examples of the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, and the like, but one or more embodiments are not limited thereto.

The quantum dot may have a full width of half maximum (FWHM) of the emission wavelength spectrum of less than or equal to about 45 nm, preferably less than or equal to about 40 nm, and more preferably less than or equal to about 30 nm, and the color purity and color reproducibility may be improved within the above range. Also, light emitted from the quantum dot may be discharged in all directions, and thus, a viewing angle of the light may be improved.

Also, a shape of the quantum dot is not specifically limited to a shape generally used in the art, and in more detail, the shape of the quantum dot may be a circle, a pyramid, a multi-arm, a cubic nanoparticle, a nanotube, a nanowire, a nanofiber, a plate-shaped nanoparticle, and the like.

The quantum dot may adjust a color of emitted light according to a particle size, and thus, the quantum dot may have various emission colors such as blue, red, and green.

Figure 21:
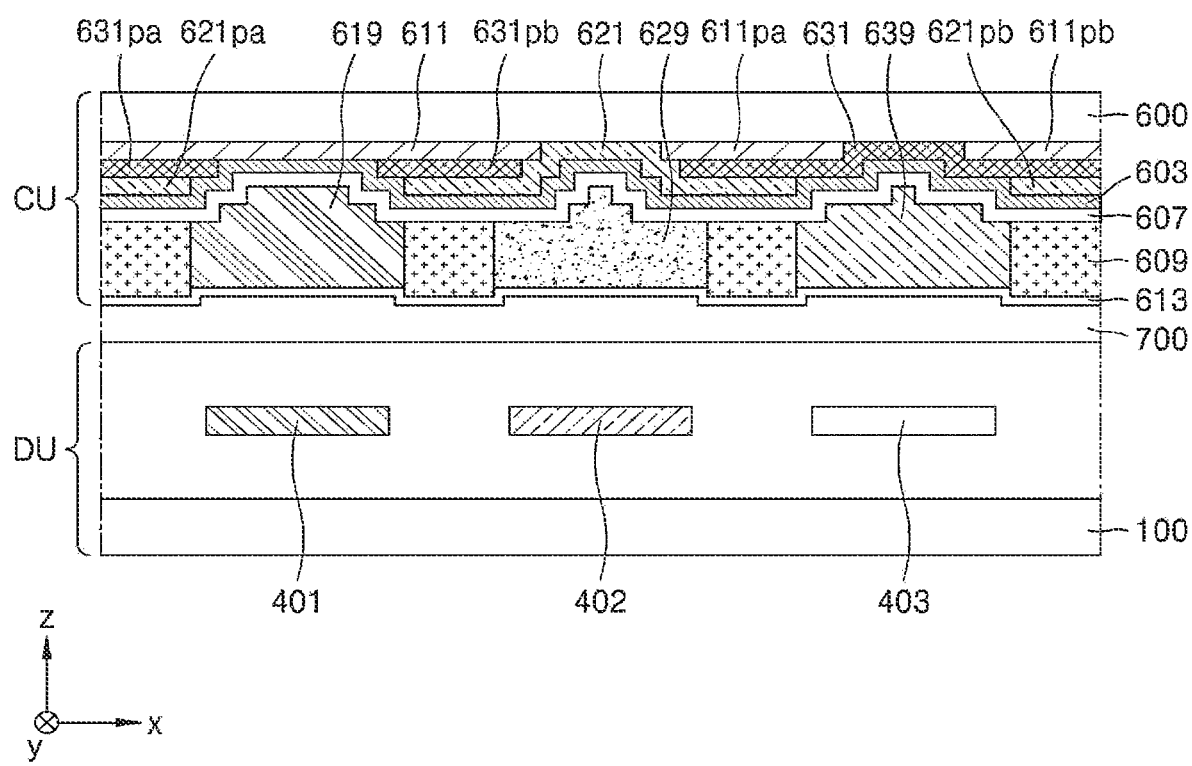
FIG. 21 is a schematic cross-sectional view of a portion of a display apparatus, according to some embodiments.

FIG. 21 is a schematic cross-sectional view of a portion of a display apparatus, according to some embodiments.

Referring to FIG. 21, the display apparatus 1 (see FIG. 19) may include the display unit DU and the color filter unit CU. The filler material 700 may be arranged between the display unit DU and the color filter unit CU.

The display unit DU may include the substrate 100 and the first light-emitting diode 401, the second light-emitting diode 402, and the third light-emitting diode 403 arranged on the substrate 100. The first light-emitting diode 401, the second light-emitting diode 402, and the third light-emitting diode 403 may each include a first-color emission layer.

The color filter unit CU may include the upper substrate 600, the first-color color filter layer 611, the second-color color filter layer 621, the third-color color filter layer 631, a low refractive index layer 603, a first capping layer 607, an insulation layer 609, the penetration layer 619, the second-color quantum dot layer 629, the third-color quantum dot layer 639, and a second capping layer 613.

Hereinafter, for convenience of explanation, components on the upper substrate 600 are sequentially described in a stacked order (e.g., in the −z direction).

The upper substrate 600 may include a glass material, a ceramic material, a metallic material, or a flexible or bendable material. When the upper substrate 600 includes a flexible or bendable material, the upper substrate 600 may include polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate. The upper substrate 600 may have a single-layer structure or a multilayered structure including the above materials, and when the upper substrate 600 has a multilayered structure, the upper substrate 600 may further include an inorganic layer. In some embodiments, the upper substrate 600 may have a structure of organic/inorganic/organic materials.

The first-color color filter layer 611 may be arranged on the upper substrate 600 to correspond to the first light-emitting diode 401, the second-color color filter layer 621 may be arranged on the upper substrate 600 to correspond to the second light-emitting diode 402, and the third-color color filter layer 631 may be arranged on the upper substrate 600 to correspond to the third light-emitting diode 403. In other words, when viewed in a direction perpendicular to the upper substrate 600 (a ±z direction), the first-color color filter layer 611 may overlap the first light-emitting diode 401, the second-color color filter layer 621 may overlap the second light-emitting diode 402, and the third-color color filter layer 631 may overlap the third light-emitting diode 403.

The first-color color filter layer 611 may only pass light in a wavelength ranging from about 450 nm to about 495 nm, the second-color color filter layer 621 may only pass light in a wavelength ranging from about 495 nm to about 570 nm, and the third-color color filter layer 631 may only pass light in a wavelength ranging from about 630 nm to about 780 nm. The first-color color filter layer 611, the second-color color filter layer 621, and the third-color color filter layer 631 may reduce the external light reflection in the display apparatus 1.

For example, when external light reaches the first-color color filter layer 611, the light in the wavelength in the preset range described above may only pass the first-color color filter layer 611, and light in other wavelengths may be absorbed into the first-color color filter layer 611. Therefore, the light in the preset range described above among the external light incident to the display apparatus 1 only passes the first-color color filter layer 611, and part of the light is reflected from a conductive layer (e.g., the opposite electrode or the pixel electrode) arranged under the first-color color filter layer 611 and discharged to the outside. In the end, because part of the external light, which is incident to a location of the first light-emitting diode 401, is reflected to the outside, external light reflection may decrease. The above descriptions may also be applied to the second-color color filter layer 621 and the third-color color filter layer 631.

According to some embodiments, as shown in FIG. 21, when viewed in the direction perpendicular to the upper substrate 600 (the ±z direction), the first-color color filter layer 611 and the second-color color filter layer 621 may at least partially overlap each other, and the second-color color filter layer 621 and the third-color color filter layer 631 may at least partially overlap each other.

On one side of the first-color color filter layer 611, a 3-1-color color filter pattern 631*pa* and a 2-1-color color filter pattern 621*pa* may be sequentially arranged. A 3-2-color color filter pattern 631*pb* may be arranged on the other side of the first-color color filter layer 611 that at least partially overlaps the second-color color filter layer 621. The 3-2-color color filter pattern 631*pb* may be arranged between the first-color color filter layer 611 and the second-color color filter layer 621. The 2-1-color color filter pattern 621*pa* may have the same function as the second-color color filter layer 621, and the 3-1-color color filter pattern 631*pa* and the 3-2-color color filter pattern 631*pb* may have the same functions as the third-color color filter layer 631. In this case, one side of the first-color color filter layer 611, the 3-1-color color filter pattern 631*pa*, and the 2-1-color color filter pattern 621*pa*, which overlap each other in the ±z direction, may have the same functions as a black matrix including carbon black, or the like. The other side of the first-color color filter layer 611, the 3-2-color color filter pattern 631*pb*, and one side of the second-color color filter layer 621, which overlap each other in the ±z direction, may have the same functions as the black matrix.

A 1-1-color color filter pattern 611pa may be arranged between the upper substrate 600 and one side of the third-color color filter layer 631 which at least partially overlaps the second-color color filter layer 621. A 1-2-color color filter pattern 611pb may be arranged between the other side of the third-color color filter layer 631 and the upper substrate 600, and a 2-2-color color filter pattern 621pb may be arranged on the other side of the third-color color filter layer 631. The 1-1-color color filter pattern 611pa and the 1-2-color color filter pattern 611pb may have the same functions as the first-color color filter layer 611, and the 2-2-color color filter pattern 621pb may have the same functions as the second-color color filter layer 621. In this case, the 1-1-color color filter pattern 611pa, one side of the third-color color filter layer 631, and the other side of the second-color color filter layer 621, which overlap each other in the ±z direction, may have the same functions as the black matrix. The 1-2-color color filter pattern 611pb, the other side of the third-color color filter layer 631, and the 2-2-color color filter pattern 621pb, which overlap each other in the ±z direction, may have the same functions as the black matrix.

The low refractive index layer 603 may be arranged on the first-color color filter layer 611, the second-color color filter layer 621, and the third-color color filter layer 631 to correspond to the first light-emitting diode 401, the second light-emitting diode 402, and the third light-emitting diode 403. The first capping layer 607 may be arranged on the low refractive index layer 603.

A refractive index of the low refractive index layer 603 may be less than that of the first capping layer 607. When the first capping layer 607 includes an inorganic material such as $SiO_x$, $SiN_x$, or SiON, a refractive index of the first capping layer 607 may be between about 1.4 and about 1.5. The refractive index of the low refractive index layer 603 may be less than that of the first capping layer 607, which may range from about, for example, 1.1 to about 1.3.

The first capping layer 607 may be integrally formed to correspond to the first light-emitting diode 401, the second light-emitting diode 402, and the third light-emitting diode 403. The first capping layer 607 may include an inorganic material such as $SiO_x$, $SiN_x$, or SiON.

The penetration layer 619 may be arranged on the first capping layer 607 to correspond to the first light-emitting diode 401, the second-color quantum dot layer 629 may be arranged on the first capping layer 607 to correspond to the second light-emitting diode 402, and the third-color quantum dot layer 639 may be arranged on the first capping layer 607 to correspond to the third light-emitting diode 403. To this end, the insulation layer 609 having openings respectively corresponding to the first light-emitting diode 401, the second light-emitting diode 402, and the third light-emitting diode 403 may be arranged on the first capping layer 607. The description that the openings in the insulation layer 609 respectively correspond to the first light-emitting diode 401, the second light-emitting diode 402, and the third light-emitting diode 403 may indicate that, when viewed in the direction perpendicular to the substrate 100 (the ±z direction), the openings may respectively overlap the first light-emitting diode 401, the second light-emitting diode 402, and the third light-emitting diode 403.

The insulation layer 609 may include various materials, for example, inorganic materials such as $SiO_x$, $SiN_x$, and SiON. Alternatively, the insulation layer 609 may include a black matrix and may be a member for improving the color clarity and contrast. The insulation layer 609 may include at least one of black pigments, black dyes, or black particles.

In some embodiments, the insulation layer 609 may include Cr or $CrO_x$, $Cr/CrO_x$, $Cr/CrO_x/CrN_y$, resin (carbon pigments or RGB mix pigments), graphite, non-Cr-based materials, or the like.

As described above with reference to FIG. 20, the penetration layer 619 may include the first photosensitive polymer 619c on which the first scattered particles 619b are spread, the second-color quantum dot layer 629 may include the first quantum dots 629a and the second photosensitive polymer 629c on which the second scattered particles 629b are spread, and the third-color quantum dot layer 639 may include the second quantum dots 639a and the third photosensitive polymer 639c on which the third scattered particles 639b are spread.

The second capping layer 613 may be arranged on the penetration layer 619, the second-color quantum dot layer 629, and the third-color quantum dot layer 639. The second capping layer 613 may be integrally formed to correspond to the first light-emitting diode 401, the second light-emitting diode 402, and the third light-emitting diode 403. The second capping layer 613 may include an inorganic material such as $SiO_x$, $SiN_x$, or SiON.

For convenience of explanation, the components on the upper substrate 600 are sequentially described in the stacked order (e.g., in the −z direction), but when the descriptions are provided based on the substrate 100 (e.g., in the +z direction), a stacked order of layers forming the color filter unit CU may be expressed in an opposite way. For example, the first capping layer 607 may be described as being arranged on the penetration layer 619, the second-color quantum dot layer 629, and the third-color quantum dot layer 639 to correspond to the first light-emitting diode 401, the second light-emitting diode 402, and the third light-emitting diode 403. The low refractive index layer 603 may be described as being arranged on the first capping layer 607. The first-color color filter layer 611 may be arranged on the low refractive index layer 603 to correspond to the first light-emitting diode 401, the second-color color filter layer 621 may be arranged on the low refractive index layer 603 to correspond to the second light-emitting diode 402, and the third-color color filter layer 631 may be arranged on the low refractive index layer 603 to correspond to the third light-emitting diode 403.

According to one or more embodiments, a deviation in delay of signals applied to a display area may be improved. Therefore, defects in a display apparatus may be prevented or reduced. However, the scope of the disclosure is not limited by the effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and their equivalents.

What is claimed is:
1. A display apparatus comprising:
   a substrate having a display area and a peripheral area at a periphery of the display area;
   a plurality of conductive lines on one side of the peripheral area in a first direction and extending in a second direction crossing the first direction;

a first insulating line on the plurality of conductive lines between a first conductive line and a second conductive line, which are adjacent to each other from among the plurality of conductive lines, and extending in and elongated along the second direction such that opposing edges of the first insulating line that extend parallel to the second direction are between the first and second conductive lines; and a second insulating line on the plurality of conductive lines between a third conductive line and a fourth conductive line, which are adjacent to each other from among the plurality of conductive lines, and extending in and elongated along the second direction such that opposing edges of the second insulating line that extend parallel to the second direction are between the third and fourth conductive lines.

2. The display apparatus of claim 1, wherein
the first conductive line, the second conductive line, the third conductive line, and the fourth conductive line are sequentially arranged in the first direction, and
the display apparatus further comprises at least one third insulating line on the plurality of conductive lines, between conductive lines located between the second conductive line and the third conductive line from among the plurality of conductive lines, and extending in the second direction.

3. The display apparatus of claim 2, wherein
a length of the at least one third insulating line in the second direction is less than each of a length of the first insulating line in the second direction and a length of the second insulating line in the second direction.

4. The display apparatus of claim 2, wherein
a width of the at least one third insulating line in the first direction is greater than or substantially equal to each of a width of the first insulating line in the first direction and a width of the second insulating line in the first direction.

5. The display apparatus of claim 1, wherein
first edges on both sides of the first insulating line extending in the second direction are between a first center line of the first conductive line and a second center line of the second conductive line that are in the second direction, and
second edges on both sides of the second insulating line extending in the second direction are between a third center line of the third conductive line and a fourth center line of the fourth conductive line that are in the second direction.

6. The display apparatus of claim 1, further comprising an insulating pattern overlapping at least a portion of the second conductive line and the third conductive line on the plurality of conductive lines and connecting the first insulating line to the second insulating line.

7. The display apparatus of claim 6, wherein
the insulating pattern is provided in plurality, and
the plurality of insulating patterns are spaced apart from each other in the second direction.

8. The display apparatus of claim 7, wherein each of the plurality of conductive lines comprises: a plurality of lower conductive lines spaced apart from each other in the second direction; and an upper conductive line extending in the second direction and overlapping the plurality of lower conductive lines, and
a number of the plurality of lower conductive lines of each of the plurality of conductive lines between insulating patterns that are adjacent to each other in the second direction from among the plurality of insulating patterns, is k (where, k is a natural number).

9. The display apparatus of claim 7, wherein
each of the plurality of conductive lines comprises a plurality of lower conductive lines spaced apart from each other in the second direction and an upper conductive line extending in the second direction and overlapping the plurality of lower conductive lines, and
the plurality of lower conductive lines of each of the plurality of conductive lines and the plurality of insulating patterns are alternately arranged in the second direction.

10. The display apparatus of claim 6, wherein
the first insulating line and the second insulating line each are provided in plurality,
the plurality of first insulating lines are spaced apart from each other in the second direction,
the plurality of second insulating lines are spaced apart from each other in the second direction,
the plurality of first insulating lines and the plurality of second insulating lines are alternately arranged in the second direction, and
the insulating pattern comprises a plurality of first insulating patterns, which connect respective first ends of the plurality of first insulating lines to respective second ends of the plurality of second insulating lines, and a plurality of second insulating patterns, which connect respective third ends of the plurality of first insulating lines to respective fourth ends of the plurality of second insulating lines, wherein the third ends face the first ends and the fourth ends face the second ends.

11. The display apparatus of claim 10, wherein
the plurality of first insulating patterns and the plurality of second insulating patterns are alternately arranged in the second direction.

12. The display apparatus of claim 1, further comprising:
a transistor in the display area and comprising a semiconductor layer and a gate electrode on the semiconductor layer;
a buffer layer between the substrate and the semiconductor layer; and
an interlayer insulating layer on the gate electrode,
wherein each of the plurality of conductive lines comprises a lower conductive line between the substrate and the buffer layer, and an upper conductive line overlapping the lower conductive line on the interlayer insulating layer and electrically connected to the lower conductive line.

13. The display apparatus of claim 1, further comprising a plurality of pixels in the display area,
wherein each of the plurality of pixels comprises:
a light-emitting diode comprising an anode and a cathode;
a driving transistor configured to control a size of a driving current flowing to the light-emitting diode;
a scan transistor configured to transmit a data voltage to a gate of the driving transistor in response to a scan signal; and
a sensing transistor configured to transmit a sensing voltage or an initialization voltage to the anode of the light-emitting diode in response to a sensing signal,
wherein the scan signals are respectively output according to scan clock signals transmitted through some of the plurality of conductive lines, and
the sensing signals are respectively output according to sensing clock signals transmitted through others of the plurality of conductive lines.

14. The display apparatus of claim 13, wherein
the some of the plurality of conductive lines comprise the first conductive line and the second conductive line, and
the others of the plurality of conductive lines comprise the third conductive line and the fourth conductive line.
15. The display apparatus of claim 1, further comprising:
a first light-emitting diode, a second light-emitting diode, and a third light-emitting diode, in the display area and comprising a first color emission layer;
a second-color quantum dot layer and a third-color quantum dot layer respectively on the second light-emitting diode and the third light-emitting diode;
a penetration layer on the first light-emitting diode; and
a first-color color filter layer, a second-color color filter layer, and a third-color color filter layer respectively arranged on the penetration layer, the second-color quantum dot layer, and the third-color quantum dot layer.

* * * * *